United States Patent
Li et al.

(10) Patent No.: US 8,680,588 B2
(45) Date of Patent: Mar. 25, 2014

(54) FIELD EFFECT TRANSISTOR WITH BURIED GATE PATTERN

(75) Inventors: Ming Li, Yongin-Si (KR); Dong-Uk Choi, Hwaseong-Si (KR); Chang-Woo Oh, Suwon-Si (KR); Dong-Won Kim, Seongnam-Si (KR); Min-Sang Kim, Seoul (KR); Sung-Hwan Kim, Suwon-Si (KR); Kyoung-Hwan Yeo, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1270 days.

(21) Appl. No.: 12/072,440

(22) Filed: Feb. 26, 2008

(65) Prior Publication Data
US 2008/0142904 A1 Jun. 19, 2008

Related U.S. Application Data

(62) Division of application No. 11/241,611, filed on Sep. 30, 2005, now Pat. No. 7,361,545.

(30) Foreign Application Priority Data

Dec. 21, 2004 (KR) .............................. 2004-109280

(51) Int. Cl.
*H01L 29/66* (2006.01)

(52) U.S. Cl.
USPC ................... 257/270; 257/E29.264; 438/259

(58) Field of Classification Search
USPC .......... 257/270, 250, 330, 332, 349, E29.264; 438/259, 526, 589, 283
See application file for complete search history.

(56) References Cited

U.S. PATENT DOCUMENTS

| | | | | |
|---|---|---|---|---|
| 6,570,217 B1* | 5/2003 | Sato et al. | ...................... | 257/327 |
| 6,646,307 B1* | 11/2003 | Yu et al. | ......................... | 257/347 |
| 6,989,570 B2* | 1/2006 | Skotnicki et al. | ............. | 257/347 |
| 7,002,207 B2* | 2/2006 | Kim et al. | ...................... | 257/331 |
| 7,605,025 B2* | 10/2009 | Kim et al. | ...................... | 438/151 |
| 7,605,443 B2* | 10/2009 | Ogura | ........................... | 257/522 |
| 2004/0140520 A1* | 7/2004 | Kim et al. | ...................... | 257/509 |

* cited by examiner

*Primary Examiner* — David Vu
(74) *Attorney, Agent, or Firm* — Monica H. Choi

(57) ABSTRACT

A field effect transistor includes a buried gate pattern that is electrically isolated by being surrounded by a tunneling insulating film. The field effect transistor also includes a channel region that is floated by source and drain regions, a gate insulating film, and the tunneling insulating film. The buried gate pattern and the tunneling insulating film extend into the source and drain regions. Thus, the field effect transistor efficiently stores charge carriers in the buried gate pattern and the floating channel region.

16 Claims, 35 Drawing Sheets

FIELD EFFECT TRANSISTOR WITH BURIED GATE PATTERN

The present application is a divisional of an earlier filed copending patent application with Ser. No. 11/241,611 filed on Sep. 30, 2005, for which priority is claimed. This earlier filed copending patent application with Ser. No. 11/241,611 is in its entirety incorporated herewith by reference.

The present application also claims priority under 35 USC §119 to Korean Patent Application No. 2004-109280, filed on Dec. 21, 2004, in the Korean Intellectual Property Office, the disclosure of which is incorporated herein in its entirety by reference. A certified copy of Korean Patent Application No. 2004-109280 is contained in the parent copending patent application with Ser. No. 11/241,611.

BACKGROUND OF THE INVENTION

1. Field of the Invention

The present invention relates generally to integrated circuits, and more particularly, to fabrication of a field effect transistor having a buried gate pattern for affecting a threshold voltage of the field effect transistor.

2. Description of the Related Art

Semiconductor devices can largely be classified as memory devices and non-memory devices. A unit cell of most common semiconductor devices includes at least one field effect transistor, regardless of whether the semiconductor device is a memory device or a non-memory device. For achieving high integration or performance, a miniaturized field effect transistor having high performance is desired.

In the case of a DRAM (dynamic random access memory) device, a capacitor-less 1T (one transistor)-DRAM cell has been disclosed for increasing integration of the DRAM. The 1T-DRAM cell uses a floating body effect, storing data by accumulating carriers in the floating body and reading the data using the variation of threshold voltage according to the amount of stored carriers. The 1T-DRAM cell does not use a storage capacitor, thereby reducing the size of a unit cell and enabling a non-destructive read operation.

For example, a 1T-DRAM cell that uses a colliding ionization effect when writing has been disclosed in "Memory Design Using a One-Transistor Gain Cell on SOI" by T. Ohsawa, IEEE J. Solid-State Circuits, vol 37, no. 11, 2002, pp. 1510-1522. Also, a 1T-DRAM cell that uses a drain leakage current induced by a gate when writing has been disclosed in "A Design of a Capacitorless 1T-DRAM Cell Using Gate-induced Drain Leakage (GIDL) current for Low-power and High-speed Embedded Memory" by Ejji Yoshida, IEDM, 2003, pp. 913-916.

However, in such 1T-DRAM cells of the prior art, the source/drain regions directly contact the floating body in which carriers are accumulated. Thus, carriers may leak from the floating body when power is on or during reading, since a charge leakage path is formed at the contact points between the floating body and the source/drain regions.

On the other hand, a Programmable Read Only Memory (PROM) cell that includes a buried floating gate in a substrate has been disclosed in "Programmable Read Only Memory Cell and an Arrangement thereof, and a Method of Writing, Reading, and Erasing Information to/from the Memory Cells" by 'INFINEON TECHNOLOGIES AG' published in International Patent Application PCT/EP2002/009920. FIG. 1 is a cross-sectional view of a conventional PROM cell MC disclosed in that International Patent Application.

Referring to FIG. 1, a threshold voltage of a channel layer EPI is controlled according to the accumulation of charge in a floating gate FG of the PROM cell MC. A write operation in the PROM cell MC is performed by using tunneling of charge from the channel layer EPI through an insulating layer TOX.

However in the PROM cell MC, the bottom surface of the channel layer EPI contacts a substrate 10, which results in insufficient contact area between the floating gate FG and the channel layer EPI. As a result, the effect of controlling the threshold voltage with the floating gate FG is limited in the PROM cell MC. Also, as depicted in FIG. 1, the distance between the source/drain regions and a first diffusion region 22 is relatively short, potentially providing parasitic current paths through the source region S, the first diffusion region 22, and the drain region D.

SUMMARY OF THE INVENTION

Accordingly, a field effect transistor of embodiments of the present invention includes a buried gate pattern that is electrically isolated and that is used for storing charge for affecting a threshold voltage of the field effect transistor.

The field effect transistor also includes a tunneling insulating film that surrounds the buried gate pattern comprised of a semiconductor material. The field effect transistor further includes a channel region comprised of a semiconductor material bounded by source and drain regions, a gate insulating film, and the tunneling insulating film. The buried gate pattern and the tunneling insulating film extend into the source and drain regions.

In another embodiment of the present invention, the field effect transistor further includes a select gate pattern disposed on the gate insulating film.

In a further example embodiment of the present invention, the channel region is fully depleted during operation of the field effect transistor. An amount of charge stored in the buried gate pattern determines a threshold voltage of the field effect transistor.

The present invention may be used to particular advantage when the field effect transistor forms a memory cell of a capacitor-less one transistor-DRAM device or of a non-volatile memory device. However, the present invention may be applied for any other types of semiconductor devices.

In a method of forming such a field effect transistor, at least one trench is etched around a remaining portion of a sacrificial layer, and around a remaining portion of a semiconductor layer for forming the channel region. The remaining portion of the sacrificial layer is removed to form a tunnel, and a tunneling insulating film is formed on surfaces of the tunnel. The buried gate pattern comprised of the semiconductor material is formed to be surrounded by the tunneling insulating film within the tunnel.

In another embodiment of the present invention, the at least one trench is filled with a semiconductor material, and the source and drain regions are formed with the semiconductor material filling the at least one trench.

In a further embodiment of the present invention, a dummy gate pattern is formed as an etch mask for etching the at least one trench. A mold pattern is formed to surround the dummy gate pattern. The dummy gate pattern is then removed to form an opening in the mold pattern, and the select gate pattern is formed in the opening. In that case, a width of the buried gate pattern is less than a width of the select gate pattern.

In another embodiment of the present invention, a dummy gate pattern and dummy spacers are formed as an etch mask for etching the at least one trench. A mold pattern surrounds the dummy gate pattern and the dummy spacers. The dummy gate pattern and the dummy spacers are then removed to form an opening in the mold pattern, and a select gate pattern and spacers are formed in the opening. In that case, a width of the buried gate pattern is greater than a width of the select gate pattern.

In this manner, the channel region and the buried gate pattern store charge carriers while being electrically isolated. Thus, the field effect transistor of the present invention efficiently stores such charge carriers for enhanced operation.

BRIEF DESCRIPTION OF THE DRAWINGS

The above and other features and advantages of the present invention will become more apparent when described in detailed exemplary embodiments thereof with reference to the attached drawings in which:

FIGS. 2A, 2B, 2C through 20A, 20B, and 20C are plan views and cross-sectional views of a field effect transistor fabricated with a buried gate pattern according to a first embodiment of the present invention;

FIGS. 21A, 21B, 21C through 23A, 23B, and 23C are plan views and cross-sectional views of a field effect transistor fabricated with a wider buried gate pattern according to a second embodiment of the present invention;

The figures referred to herein are drawn for clarity of illustration and are not necessarily drawn to scale. Elements having the same reference number in FIGS. 1, 2A, 2B, 2C through 23A, 23B, 23C, and 24A and 24B refer to elements having similar structure and/or function.

DETAILED DESCRIPTION OF THE INVENTION

FIGS. 2A, 2B, 2C through 20A, 20B, and 20C are plan views and cross-sectional views of a field effect transistor fabricated according to a first embodiment of the present invention. Among the drawings, FIGS. 2A, 3A, 4A . . . 20A are plan views, FIGS. 2B, 3B, 4B . . . 20B are cross-sectional views taken along line X-X' of FIGS. 2A, 3A, 4A . . . 20A, respectively, and FIGS. 2C, 3C, 4C . . . 20C are cross-sectional views taken along line Y-Y' of FIGS. 2A, 3A, 4A . . . 20A, respectively.

Figure 1:
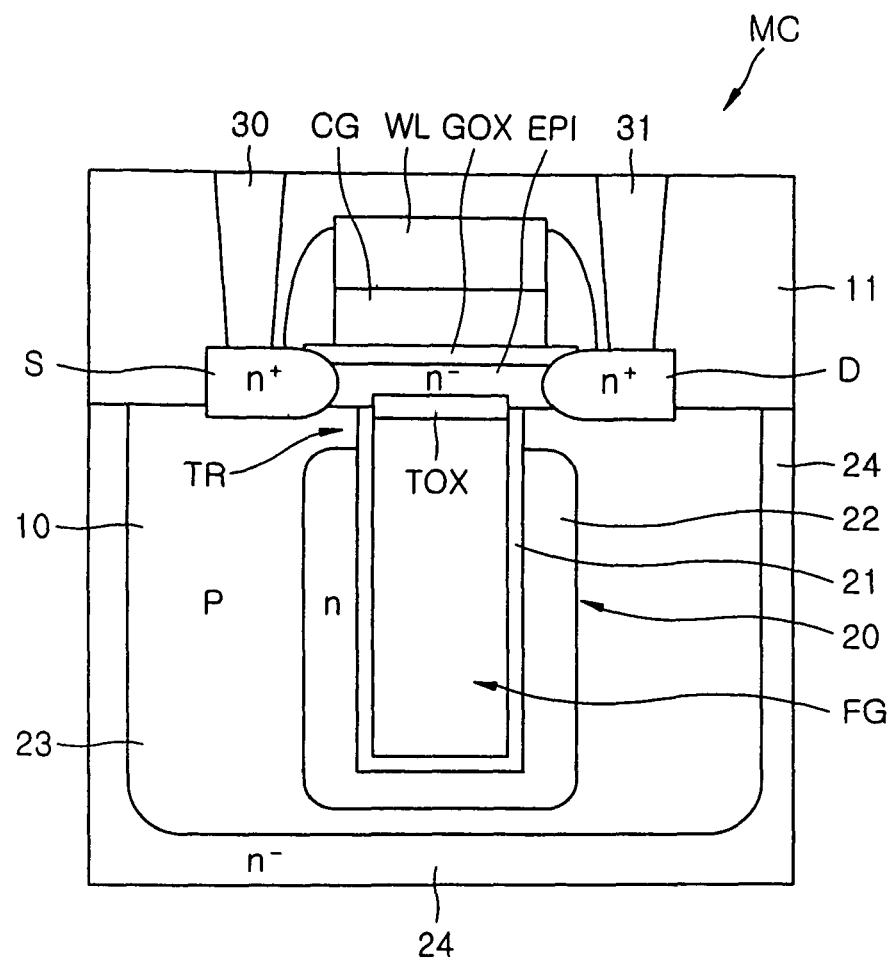
FIG. 1 is a cross-sectional view of a conventional PROM cell.
Figure 2A:
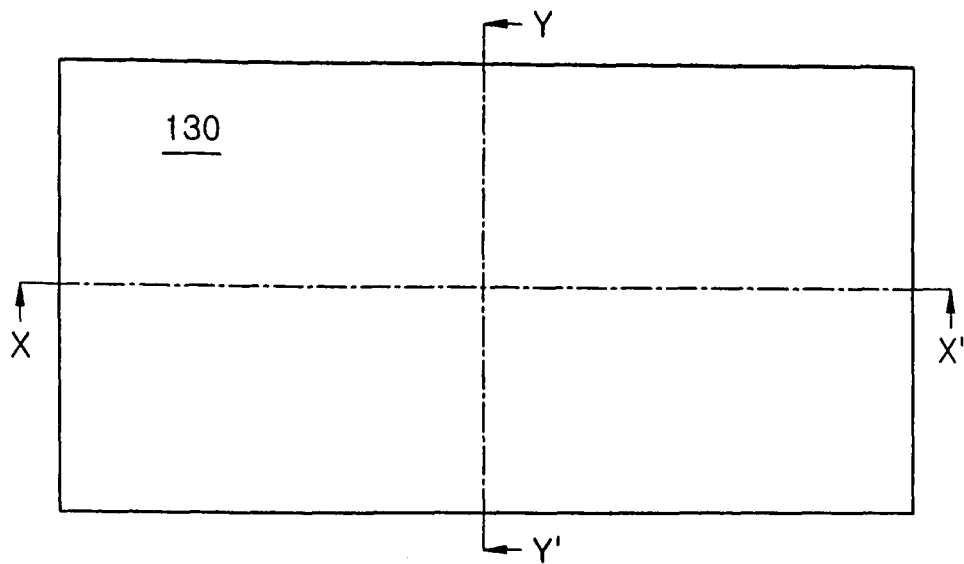
Figure 2B:
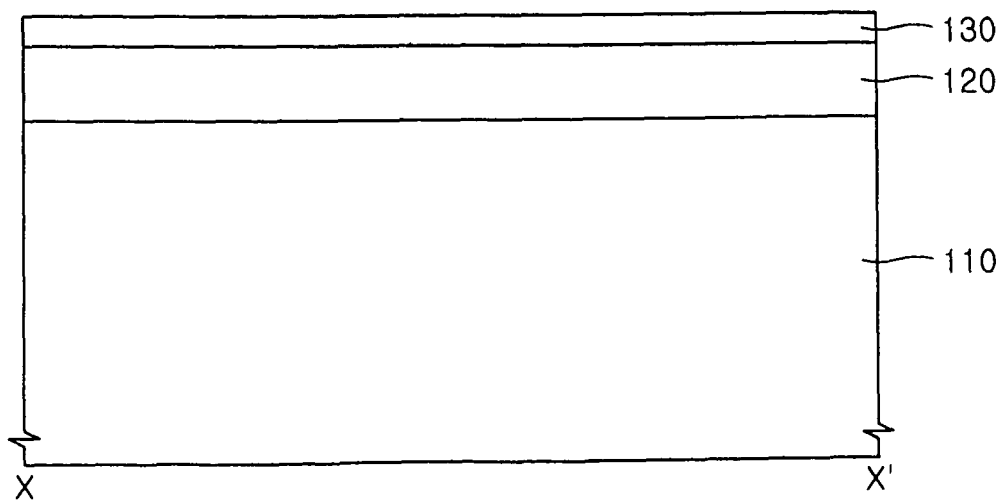
Figure 2C:
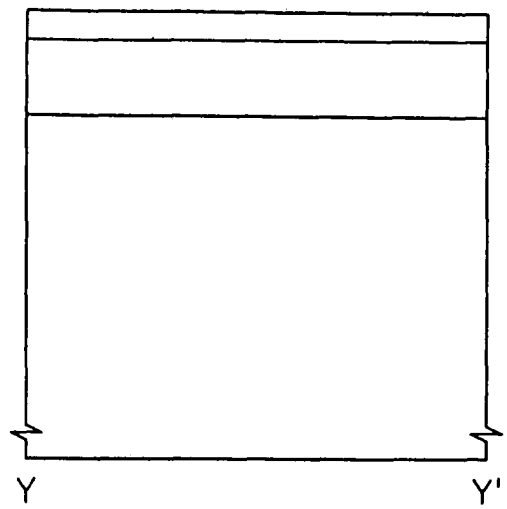

FIG. 2A is a plan view of stack layers formed on a semiconductor substrate for fabricating the field effect transistor of a first embodiment of the present invention, and FIGS. 2B and 2C are cross-sectional views respectively taken along lines X-X' and Y-Y' of FIG. 2A. Referring to FIGS. 2A through 2C, the stack layers 120 and 130 formed on a semiconductor substrate 110 include a sacrificial layer 120 and a first single crystal semiconductor layer 130. In the present embodiment, the semiconductor substrate 110 is comprised of single crystal silicon, but can be a SiGe (silicon germanium) layer, a silicon-on-insulator (SOI) substrate, or a SiGe-on-insulator (SGOI) substrate.

The stack layers 120 and 130 are formed by sequentially stacking the sacrificial layer 120 and the first single crystal semiconductor layer 130. The sacrificial layer 120 is comprised of a material having a large etch selectivity with respect to the semiconductor substrate 110. For example the sacrificial layer 120 is comprised of silicon germanium (SiGe) with a thickness of approximately 30 nm or less when the semiconductor substrate 110 is a silicon substrate, in one embodiment of the present invention.

The first single crystal semiconductor layer 130 is subsequently used to form a channel region and is preferably formed to be thin enough such that the channel region may be fully depleted. The sacrificial layer 120 and the first single crystal semiconductor layer 130 may be formed using an epitaxial growth method for easy control of thickness.

Figure 3A:
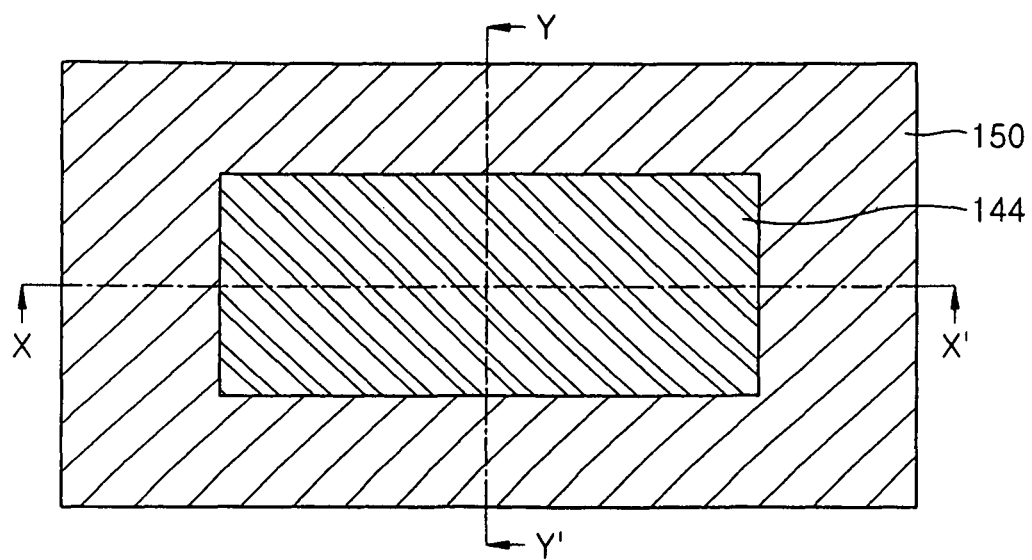
Figure 3B:
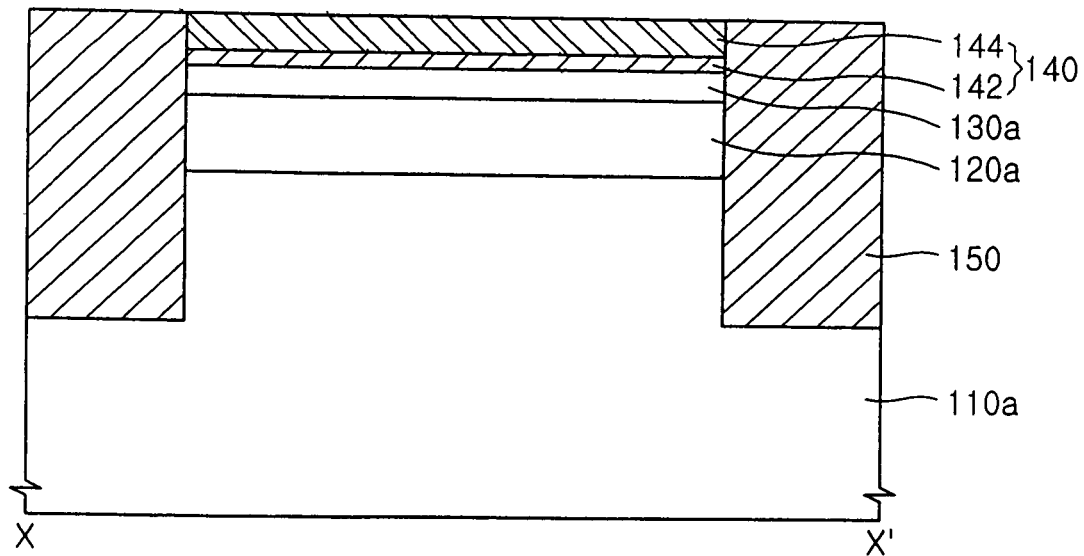
Figure 3C:
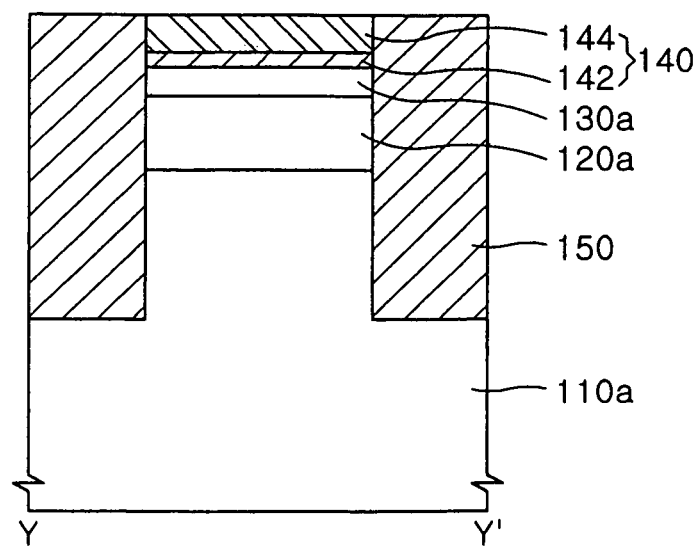

FIG. 3A is a plan view for formation of a device isolation insulating film 150 in the field effect transistor structure after FIG. 2A, and FIGS. 3B and 3C are cross-sectional views respectively taken along lines X-X' and Y-Y' of FIG. 3A. The device isolation insulating film 150 may be formed using a conventional process for forming a shallow trench isolation film.

Referring to FIGS. 3A through 3C, a hard mask pattern 140 that acts as an etch mask is formed on the entire surface of the stack layer 120 and 130. The hard mask pattern 140 is for defining an active region of the field effect transistor. The hard mask pattern 140 includes a pad oxide film pattern 142 and a mask pattern 144 comprised of silicon nitride, in one embodiment of the present invention.

A trench is initially formed by patterning the stack layers 120 and 130 and the semiconductor substrate 110 using the hard mask pattern 140 as an etch mask. Thereafter, the device isolation insulating film 150 is formed by depositing an insulating material, such as a HDP oxide film, in the trench. As a result, an active region of the field effect transistor is defined by a portion of a semiconductor substrate 110a and the stack layer patterns 120a and 130a surrounded by the device isolation insulating film 150.

Figure 4A:
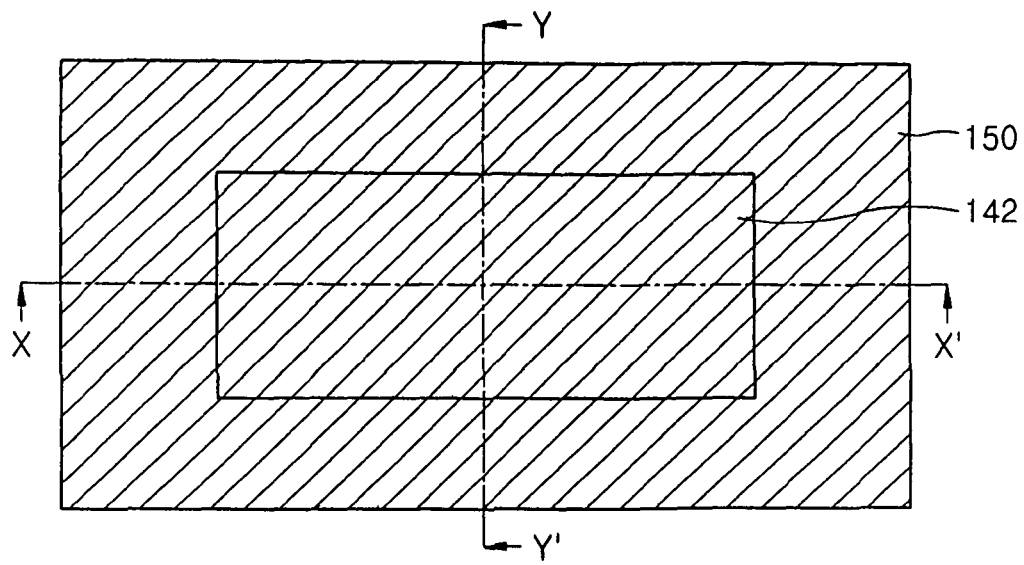
Figure 4B:
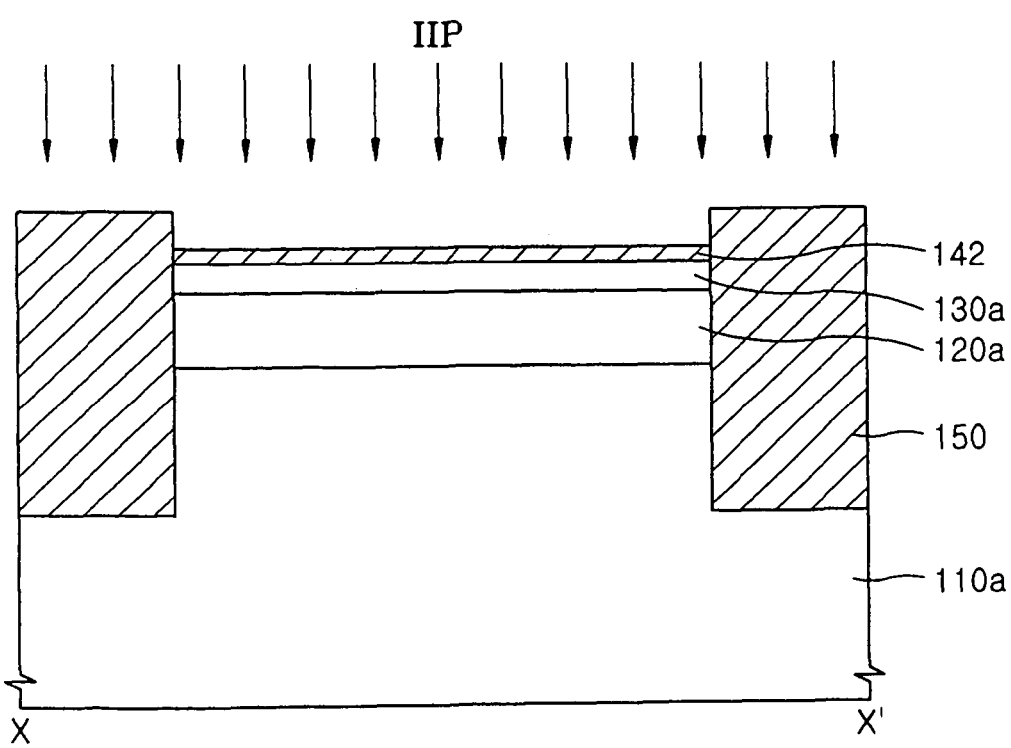
Figure 4C:
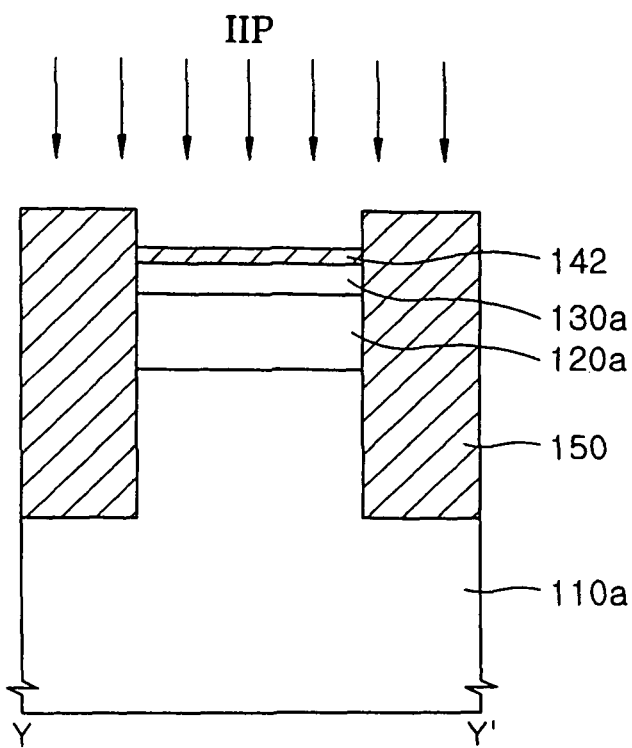

FIG. 4A is a plan view for formation of a well in the active region of the field effect transistor after FIG. 3A, and FIGS. 4B and 4C are cross-sectional views respectively taken along lines X-X' and Y-Y' of FIG. 4A. Referring to FIGS. 4A through 4C, the mask pattern 144 of the hard mask pattern 140 is removed. If the mask pattern 144 is formed of silicon nitride, the mask pattern 144 may be removed using a phosphoric acid strip process. Next, a first doping process for injecting a dopant, such as a P-type dopant, is performed on the entire surface of the resultant product. At this time, the remaining pad oxide film pattern 142 acts as a buffer for the first doping process. As a result, a well (not shown) is formed in the semiconductor substrate 110a and the stack layer patterns 120a and 130a, by injecting the P-type dopant.

Figure 5A:
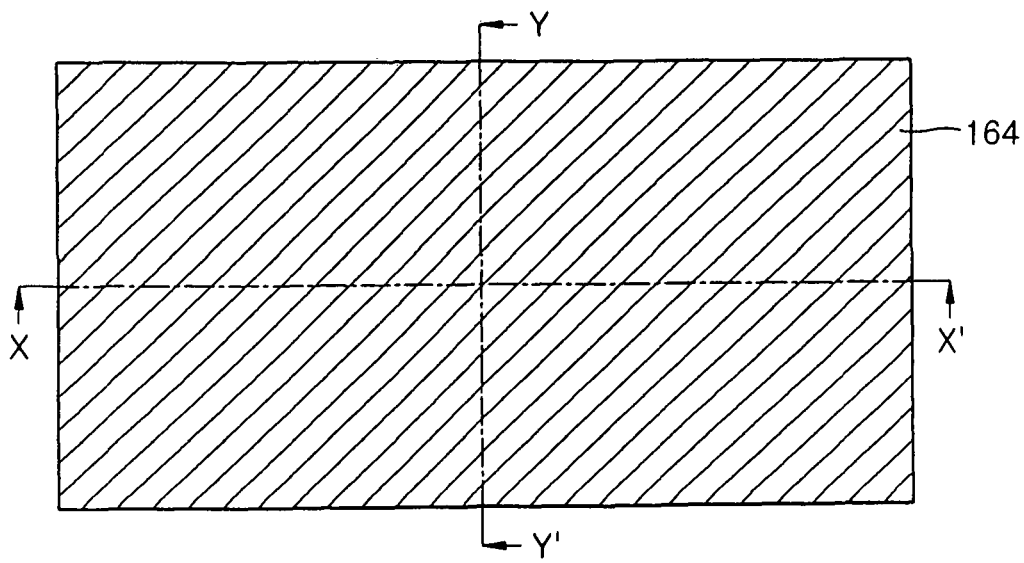
Figure 5B:
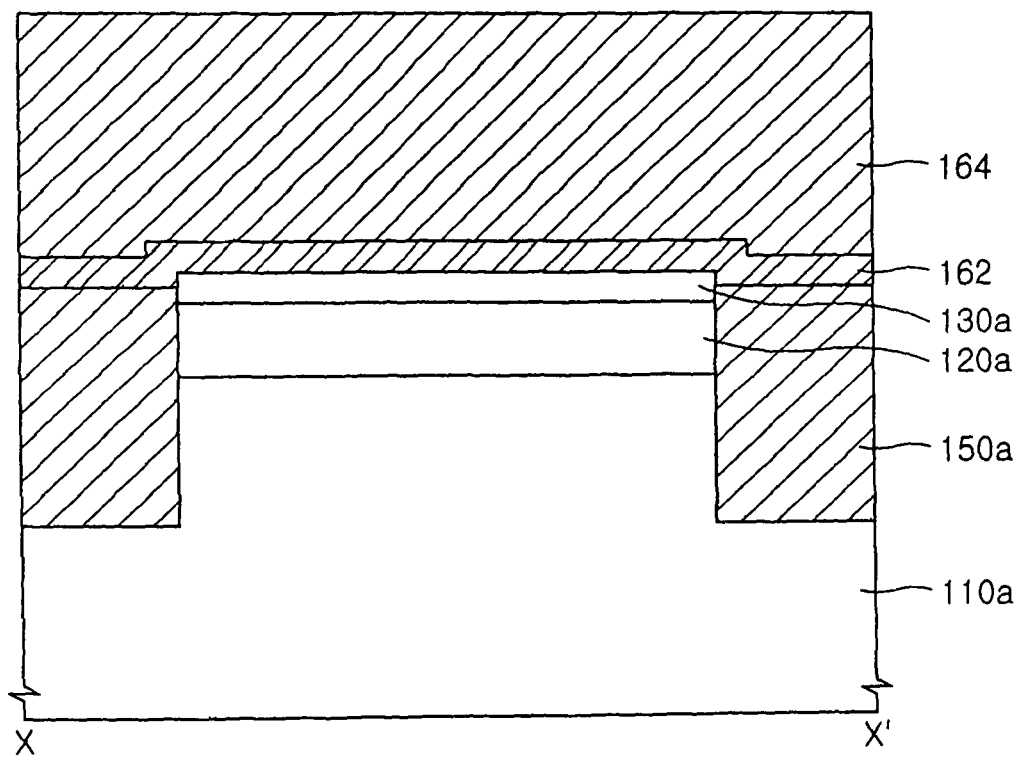
Figure 5C:
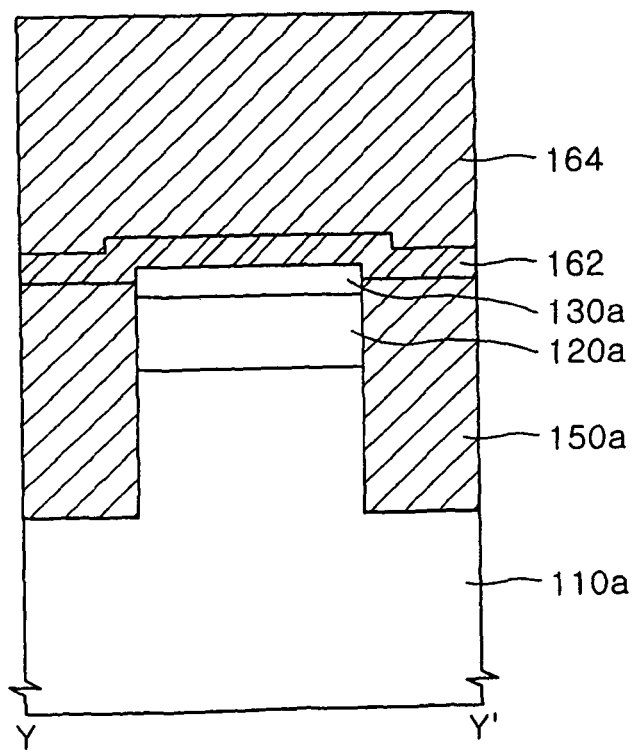

FIG. 5A is a plan view for deposition of an insulating film for forming a dummy gate of the field effect transistor after FIG. 4A, and FIGS. 5B and 5C are cross-sectional views respectively taken along lines X-X' and Y-Y' of FIG. 5A. Referring to FIGS. 5A through 5C, the pad oxide film pattern 142 formed in the active region is removed. At this time, a portion of the device isolation insulating film 150 may also be recessed (reference numeral 150a refers to the recessed portion of the device isolation insulating film 150).

An etch stopper 162 and an insulating film 164 for forming a dummy gate are sequentially formed on the first single crystal semiconductor pattern 130a and the device isolation insulating film 150a. The etch stopper 162 is comprised of silicon nitride, and the insulating film 164 is comprised of silicon oxide, such as a HDP oxide film, in an example embodiment of the present invention. The insulating film 164 is formed slightly higher than a select gate to be later formed (refer to reference numeral 194 in FIG. 20B), in an example embodiment of the present invention.

Figure 6A:
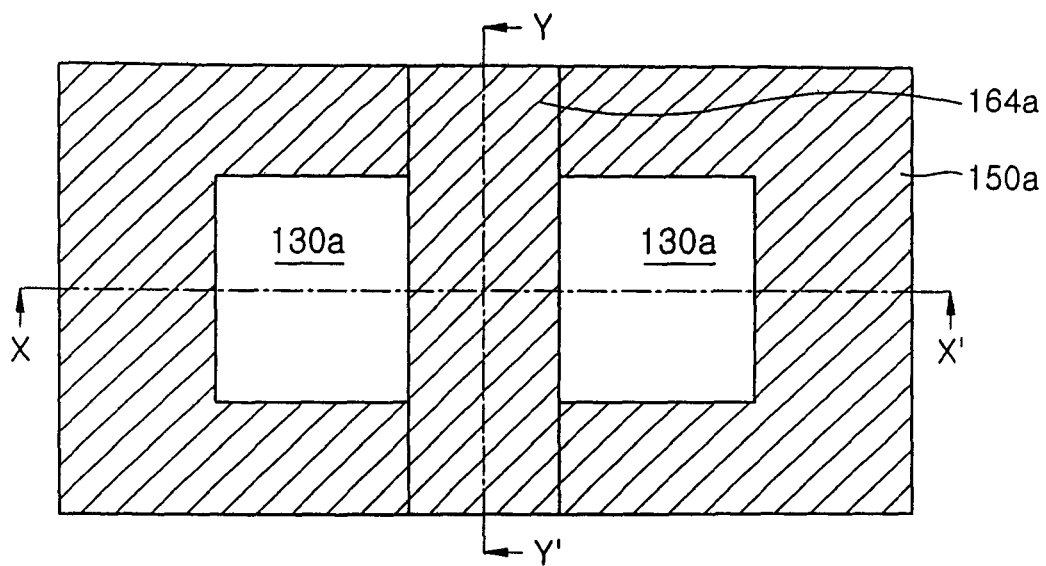
Figure 6B:
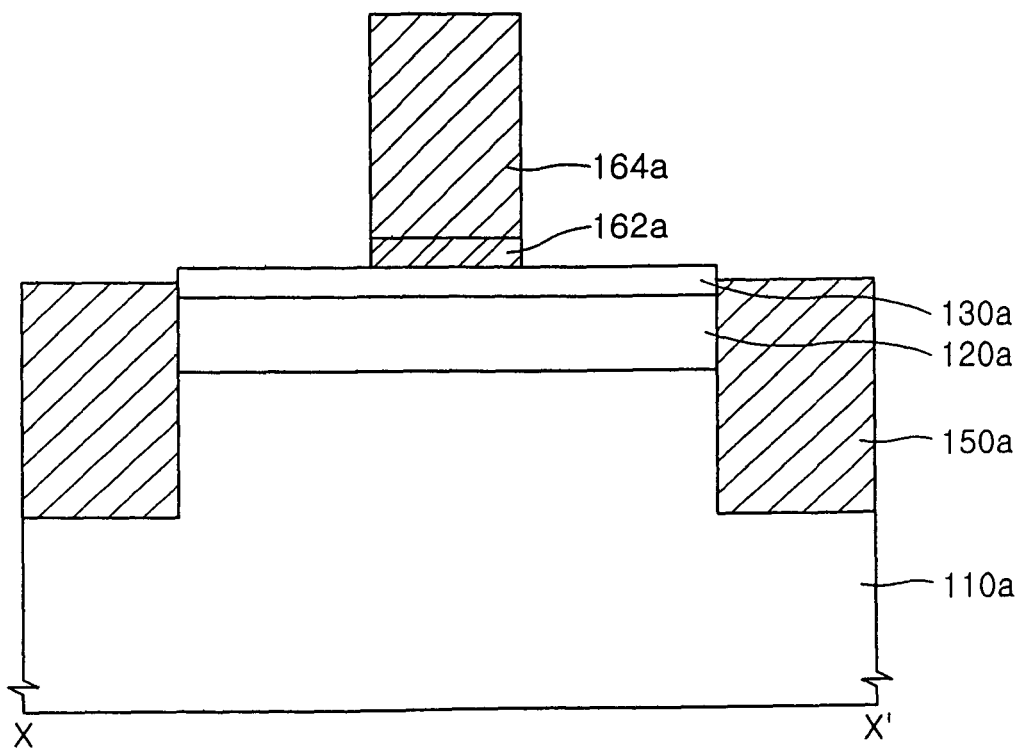
Figure 6C:
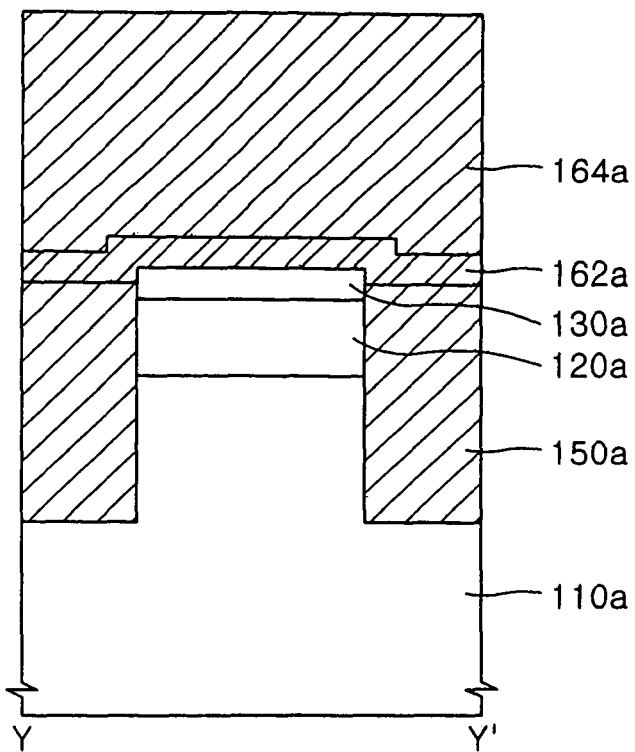

FIG. 6A is a plan view for formation of a dummy gate pattern of the field effect transistor structure after FIG. 5A, and FIGS. 6B and 6C are cross-sectional views respectively taken along lines X-X' and Y-Y' of FIG. 6A. Referring to FIGS. 6A through 6C, the insulating film 164 and the etch stopper 162 are patterned using a conventional photolithography process. At this time, a dummy gate pattern 164a is formed by patterning the insulating film 164 until the etch stopper 162 is exposed. Afterward, an etch stopper pattern 162a is formed by etching the exposed etch stopper 162. The etch stopper 162 prevents recessing the device isolation insulating film 150a by acting as an etch stopping point when etching the insulating film 164 for forming the dummy gate pattern 164a.

Figure 7A:
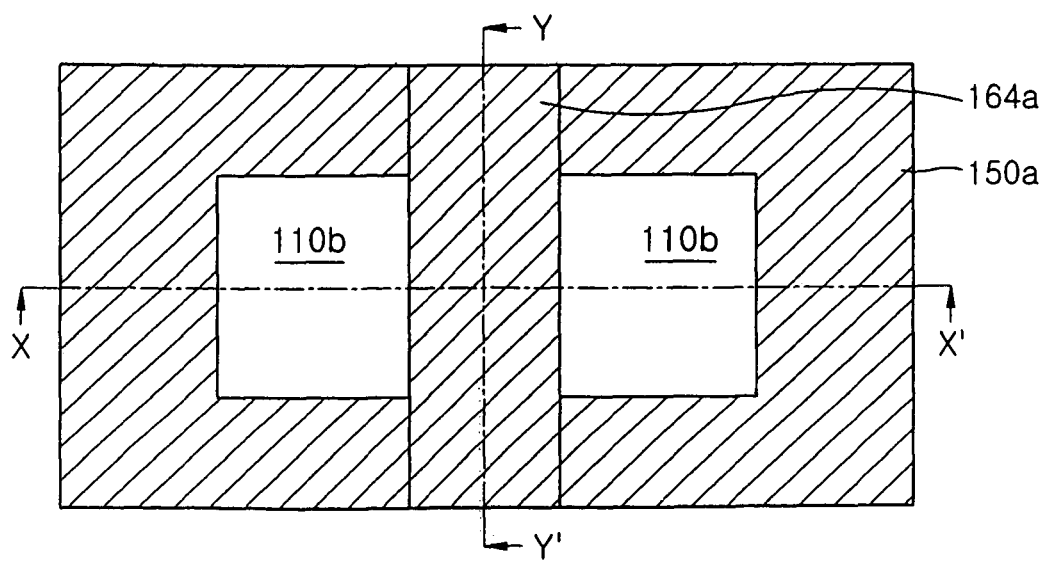
Figure 7B:
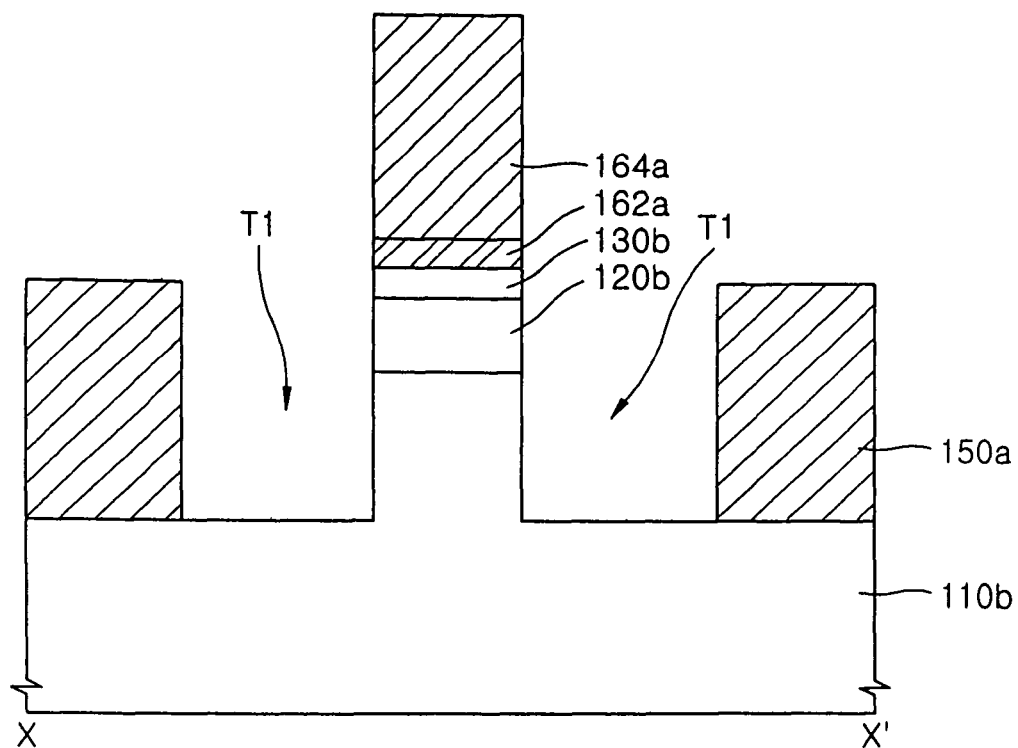
Figure 7C:
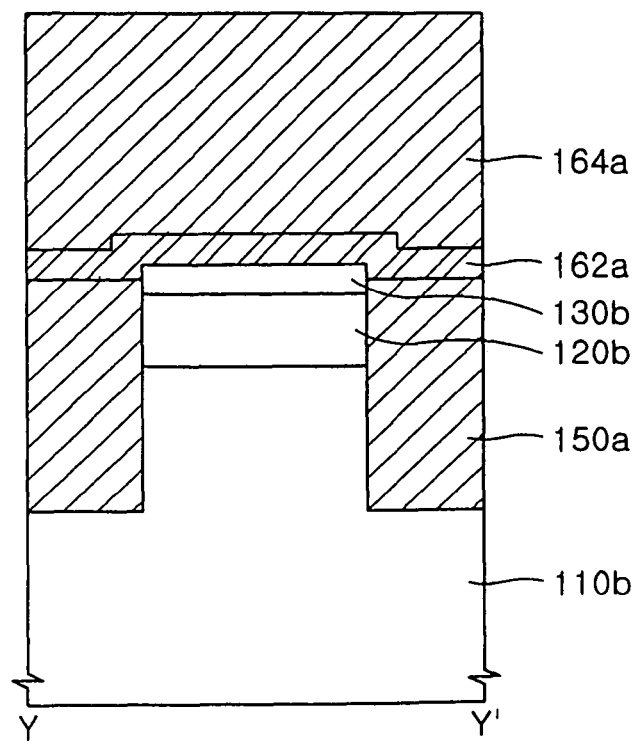

FIG. 7A is a plan view for formation of a first trench of the field effect transistor after FIG. 6A, and FIGS. 7B and 7C are cross-sectional views respectively taken along lines X-X' and Y-Y' of FIG. 7A. Referring to FIGS. 7A through 7C, the active region, that is, the remaining first single crystal semiconductor film 130a, the sacrificial layer 120a, and the semiconductor substrate 110a are anisotropically etched using the dummy gate pattern 164a and the device isolation insulating film 150a as the etch masks. As a result, a pair of trenches T1 is formed to the sides of the dummy gate pattern 164a.

More specifically, the first trench T1 is defined by the device isolation insulating film 150a, the remaining first single crystal semiconductor film 130a, the remaining sacrificial layer 120a, and the semiconductor substrate 110a. The first trench T1 is formed on a region for subsequently forming source/drain regions of the field effect transistor. The bottom surface of the first trench T1 is desired to be lower than the bottom surface of the remaining sacrificial layer 120a in one embodiment of the present invention, but is not necessarily at the same level as the bottom surface of the device isolation insulating film 150a as depicted in FIG. 7B.

Figure 8A:
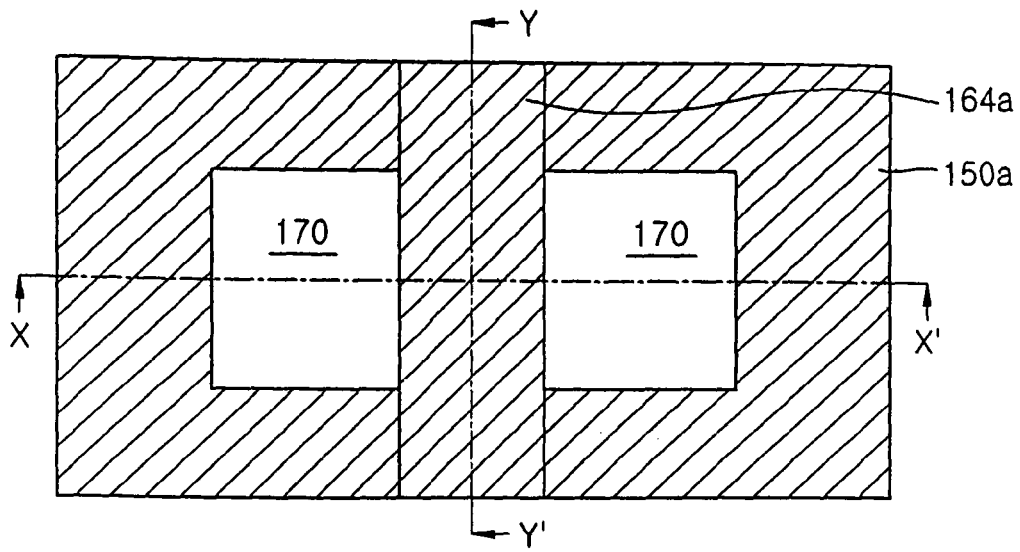
Figure 8B:
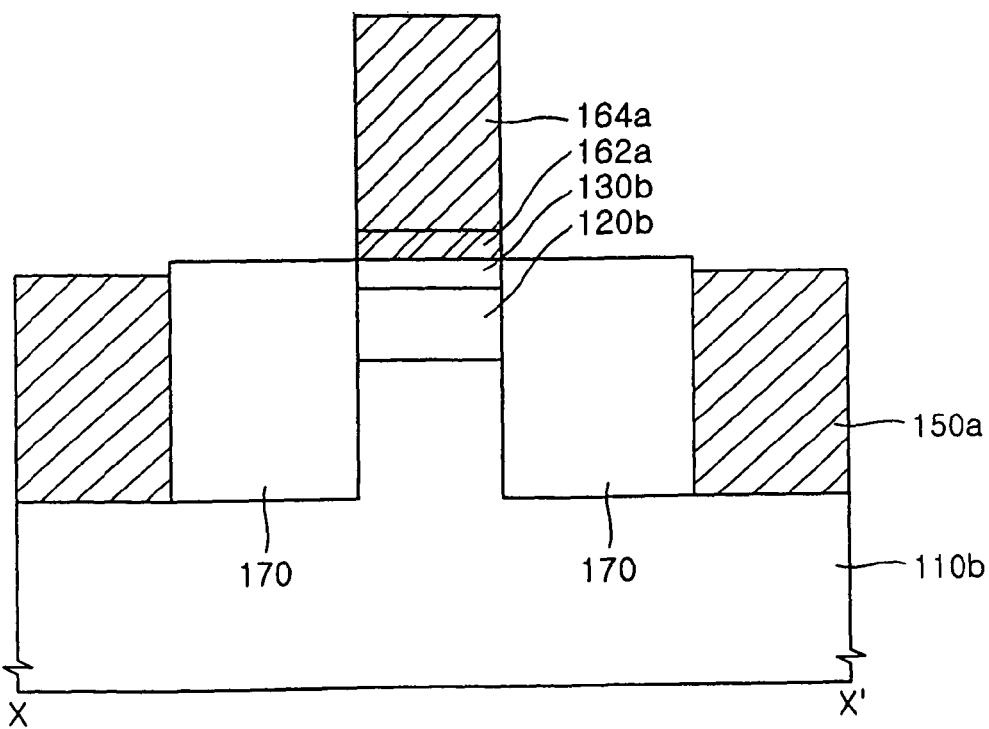
Figure 8C:
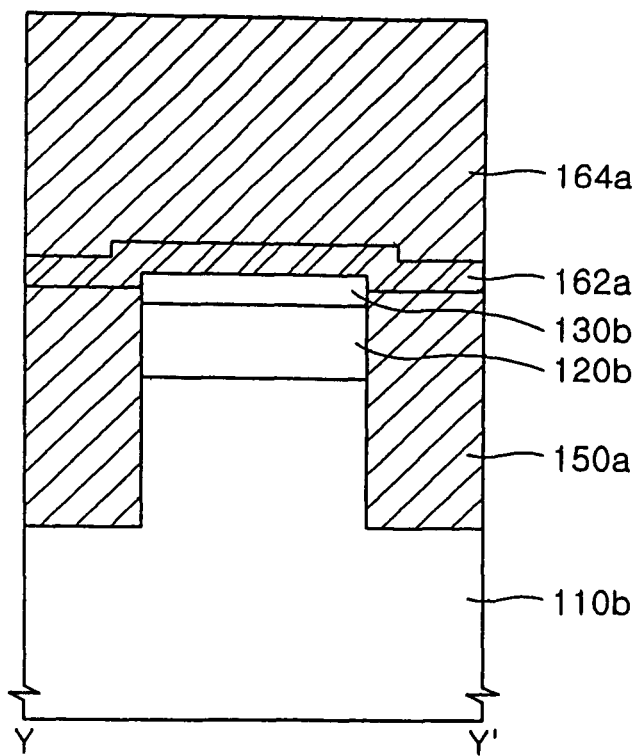

FIG. 8A is a plan view for formation of a second single crystal semiconductor layer 170 filling the trenches T1 after FIG. 7A, and FIGS. 8B and 8C are cross-sectional views respectively taken along lines X-X' and Y-Y' of FIG. 8A. Referring to FIGS. 8A through 8C, the second single crystal semiconductor layer 170, such as a silicon epitaxial layer, is formed to fill the first trench T1 using a selective epitaxial growth method. The silicon epitaxial layer 170 is formed to have a height to an upper level of the remaining first single crystal semiconductor layer 130b, in one embodiment of the present invention. As a result, all of the remaining semiconductor substrate 110b, the remaining first single crystal semiconductor layer 130b, and the second single crystal semiconductor layer 170 are comprised of single crystal silicon, in one embodiment of the present invention.

Figure 9A:
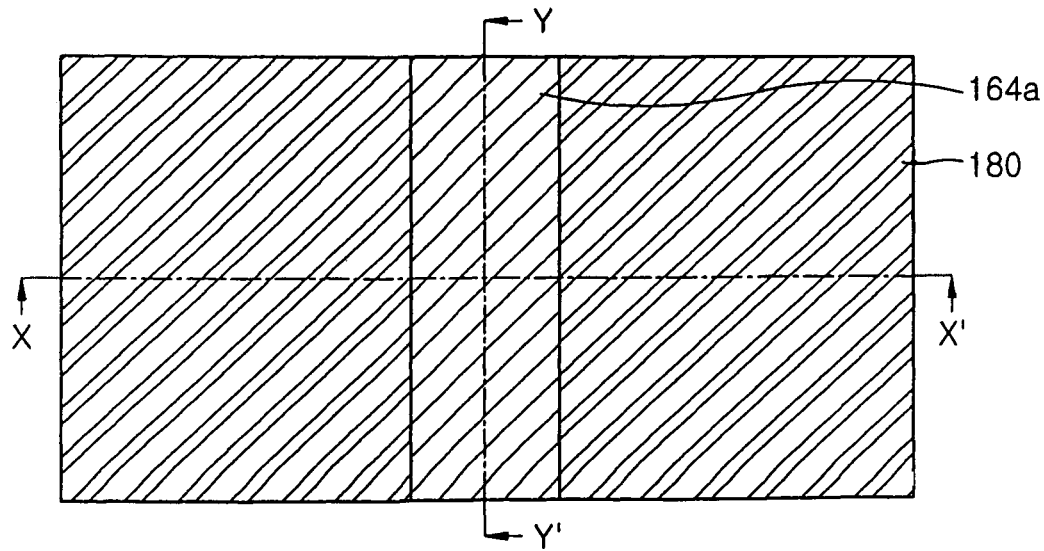
Figure 9B:
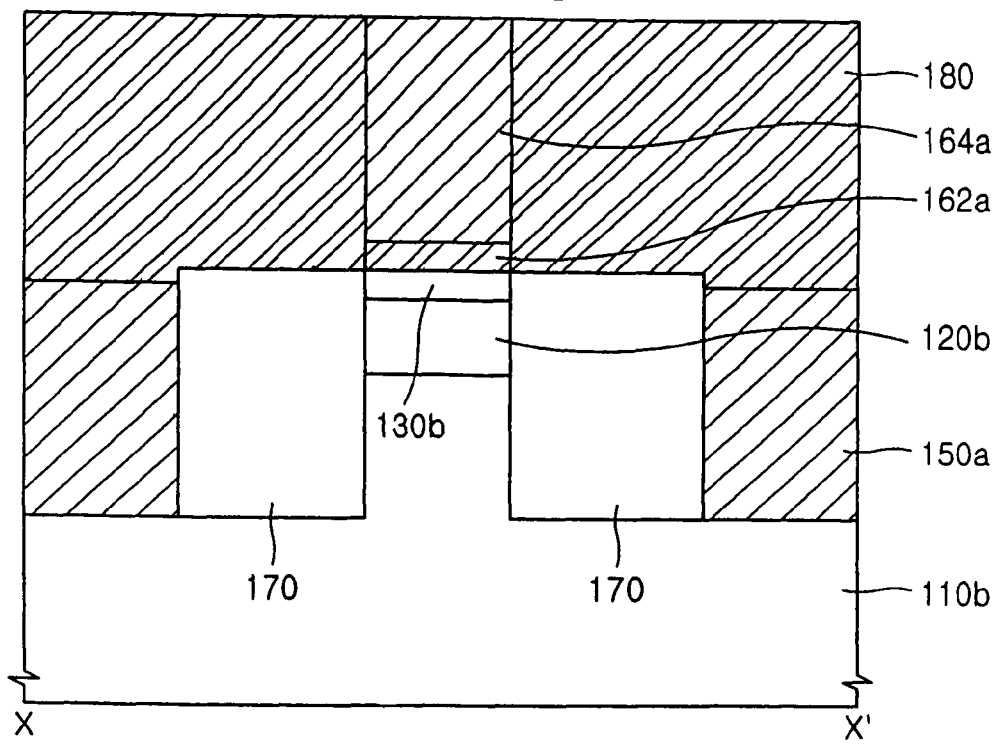
Figure 9C:
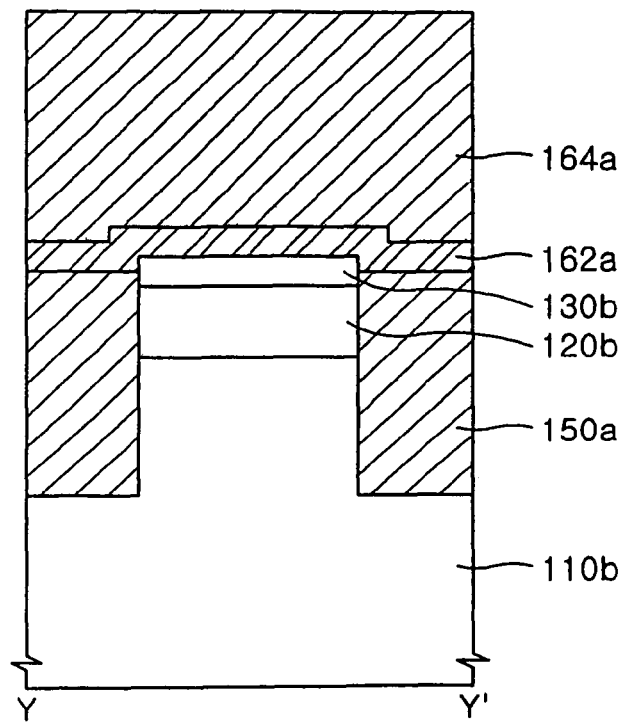

FIG. 9A is a plan view for formation of a mold pattern in the field effect transistor structure after FIG. 8A, and FIGS. 9B and 9C are cross-sectional views respectively taken along lines X-X' and Y-Y' of FIG. 9A. Referring to FIGS. 9A through 9C, after forming a mold layer on the resultant product using a conventional deposition process, a mold pattern 180 is formed by planarizing the mold layer until the upper surface of the dummy gate pattern 164a is exposed. As a result, the mold pattern 184 is formed on the second single crystal semiconductor layer 170 and the device isolation insulating film 150a. The mold pattern 184 is comprised of an insulating material, such as silicon nitride, with a high etch selectivity with respect to the dummy gate pattern 164a, in one embodiment of the present invention.

Figure 10A:
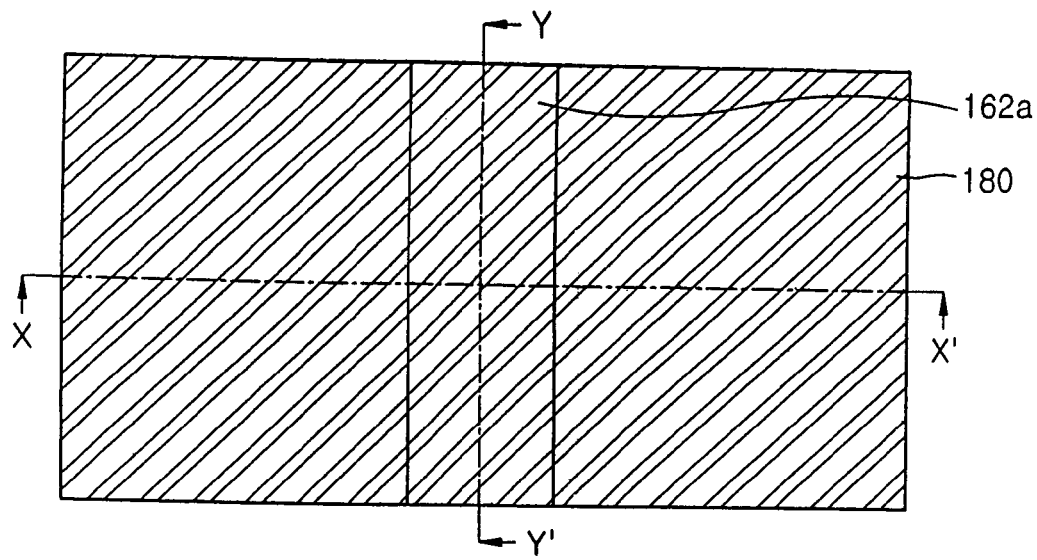
Figure 10B:
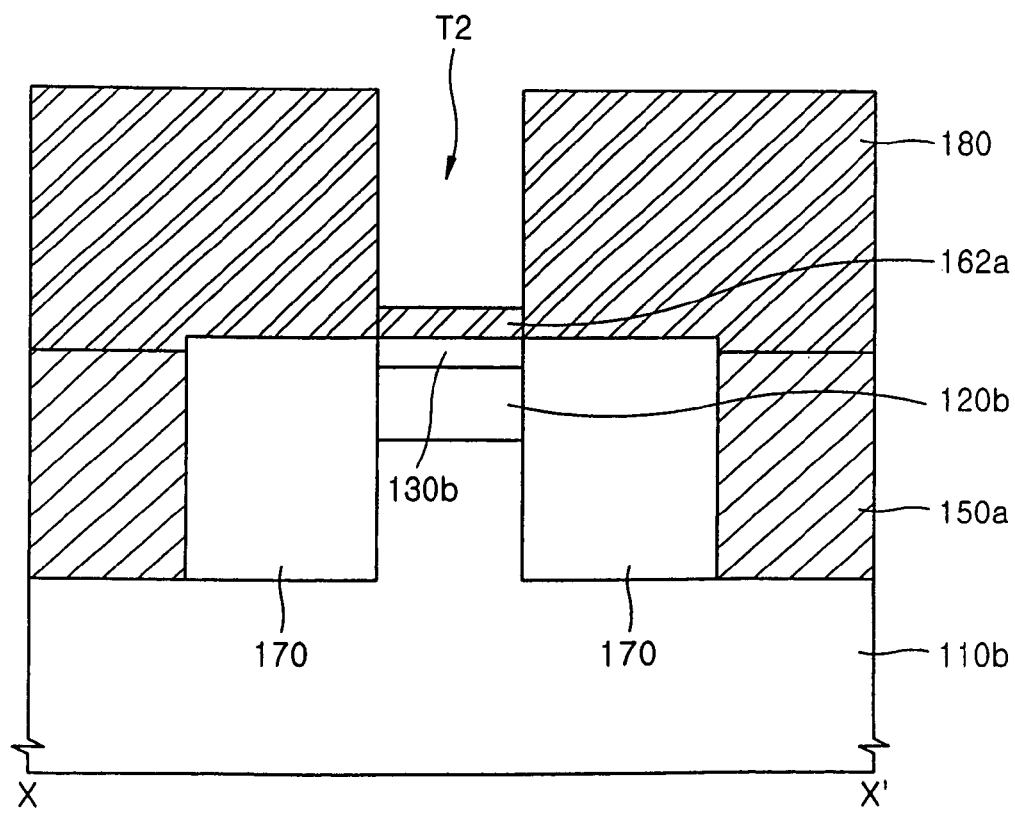
Figure 10C:
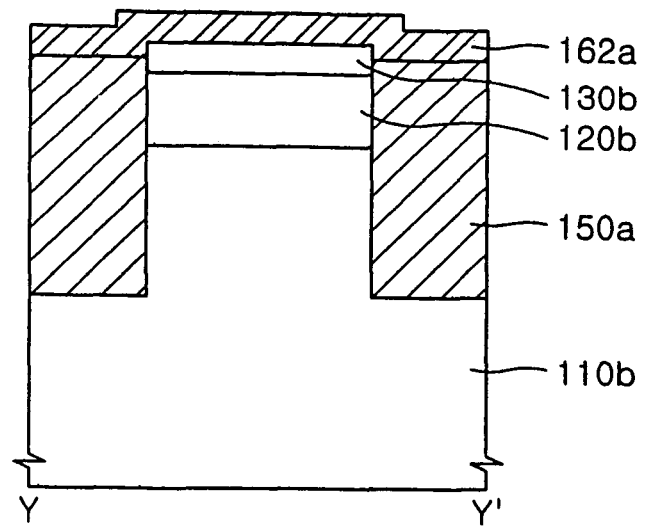

FIG. 10A is a plan view for formation of a second trench T2 in the field effect transistor after FIG. 9A, and FIGS. 10B and 10C are cross-sectional views respectively taken along lines X-X' and Y-Y' of FIG. 10A. Referring to FIGS. 10A through 10C, a second trench T2 is formed by removing the dummy gate pattern 164a using a conventional semiconductor etching process. The second trench T2 is an opening defined by the mold pattern 180. In the process for removing the dummy gate pattern 164a, the remaining etch stopper pattern 162a prevents the etching of the first single crystal semiconductor layer 130b and the device isolation insulating film 150a.

Figure 11A:
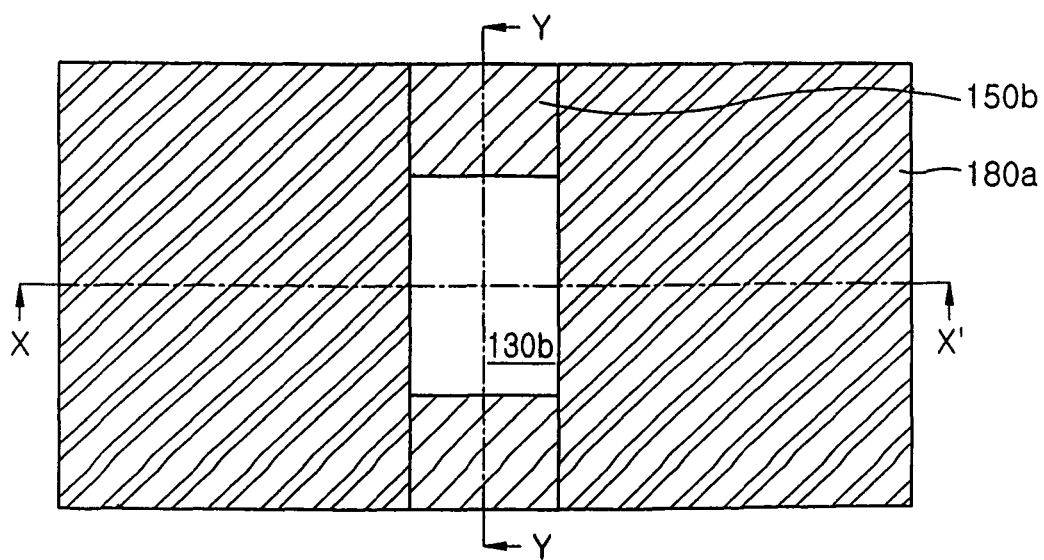
Figure 11B:
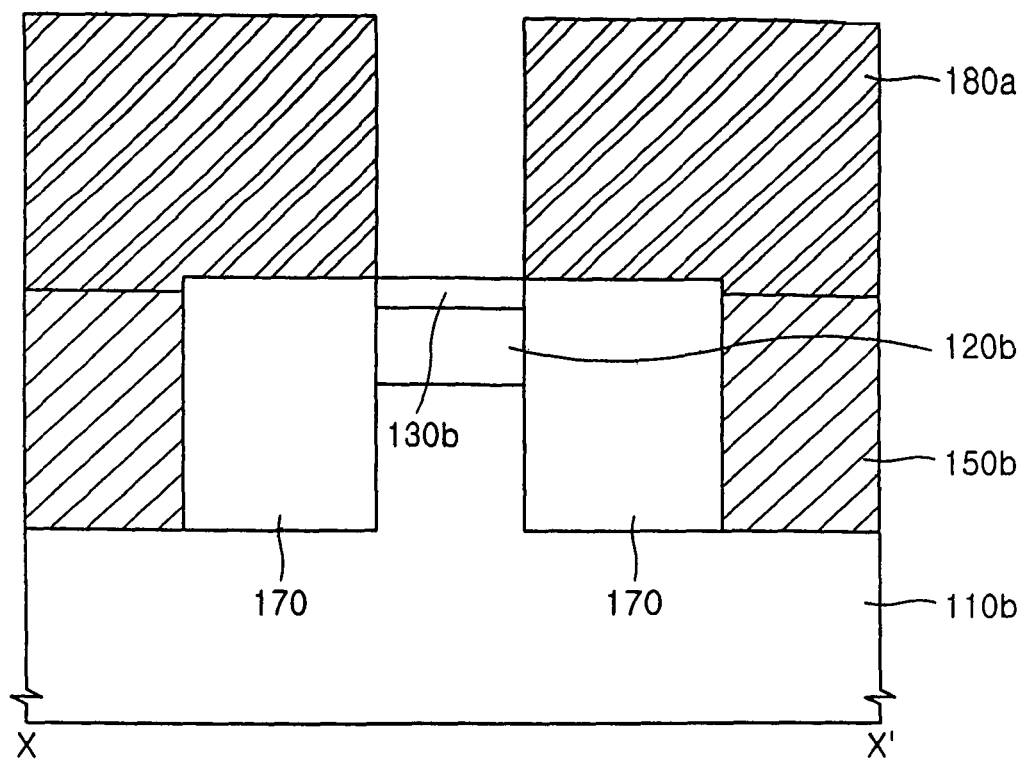
Figure 11C:
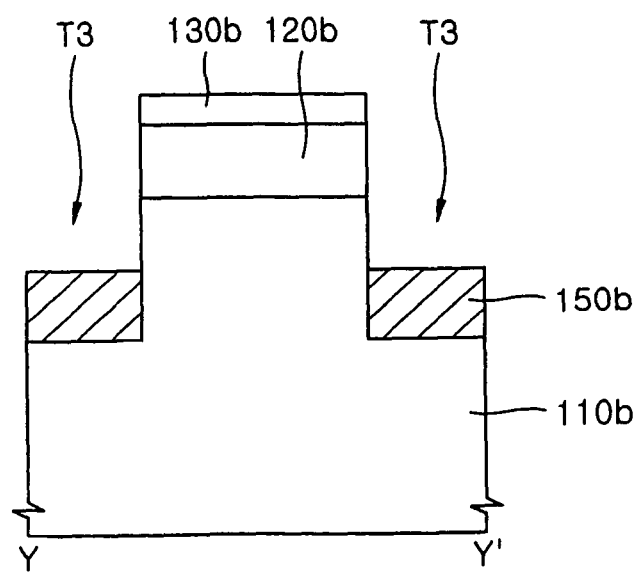

FIG. 11A is a plan view for formation of a third trench T3 in the field effect transistor after FIG. 10A, and FIGS. 11B and 11C are cross-sectional views respectively taken along lines X-X' and Y-Y' of FIG. 11A. Referring to FIGS. 11A through 11C, the etch stopper pattern 162a is removed using a conventional etch process. In the etch process, the mold pattern 180a may also be recessed. As a result, the upper surface of the first single crystal semiconductor layer 130b and the upper surface of the adjacent device isolation insulating film 150a are exposed. At this time, a portion of the device isolation insulating film 150a is exposed adjacent the first single crystal semiconductor layer 130b along the Y-Y' direction.

Next, a third trench T3 is formed by recessing the exposed device isolation insulating film 150a to a predetermined depth. As shown in FIGS. 11B and 11C, the recessed device isolation insulating film 150b (refer to FIG. 11C) has a height difference from the unrecessed device isolation insulating film 150b (refer to FIG. 11B). As the result, sides of the remaining sacrificial layer 120b are exposed by the third trench T3 across the Y-Y' direction as shown in FIG. 11C.

Figure 12A:
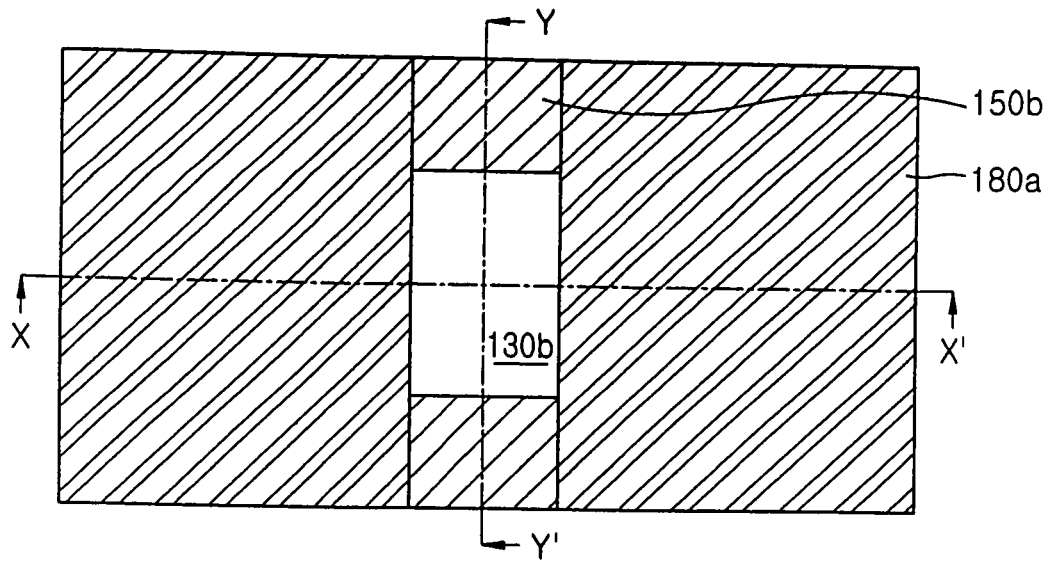
Figure 12B:
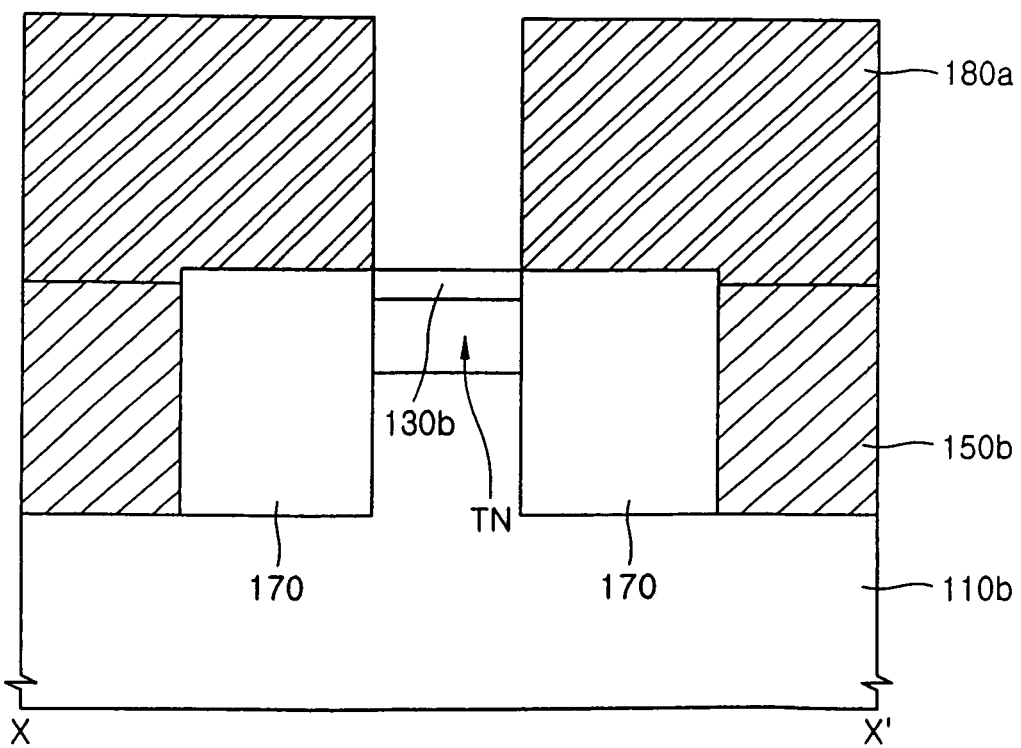
Figure 12C:
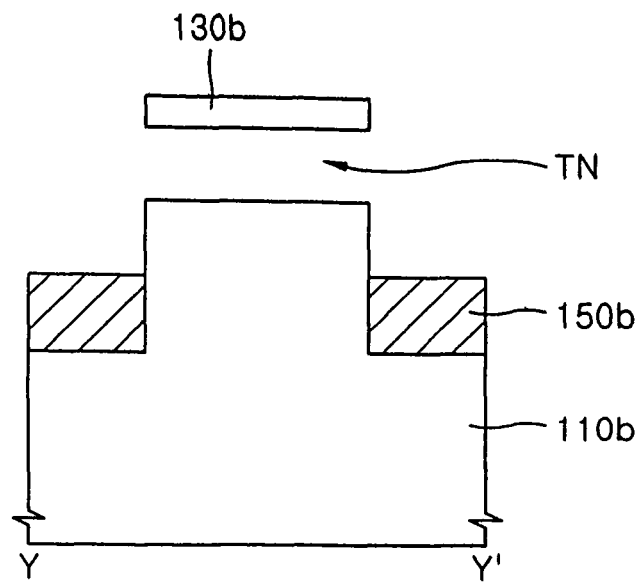

FIG. 12A is a plan view illustrating removal of the remaining sacrificial layer 120b in the field effect transistor structure after FIG. 11A, and FIGS. 12B and 12C are cross-sectional views respectively taken along lines X-X' and Y-Y' of FIG. 12A. Referring to FIGS. 12A through 12C, the remaining sacrificial layer 120b is removed by a wet etch process through the exposed sacrificial layer 120b in the third trench T3. As a result, a tunnel TN is formed that connects the third trenches T3 and is surrounded by the semiconductor substrate 110b, the remaining first single crystal semiconductor layer 130b, and the second single crystal semiconductor layer 170. The large etch selectivity of SiGe with respect to silicon is advantageous in the process for removing the sacrificial layer 120b.

Figure 13A:
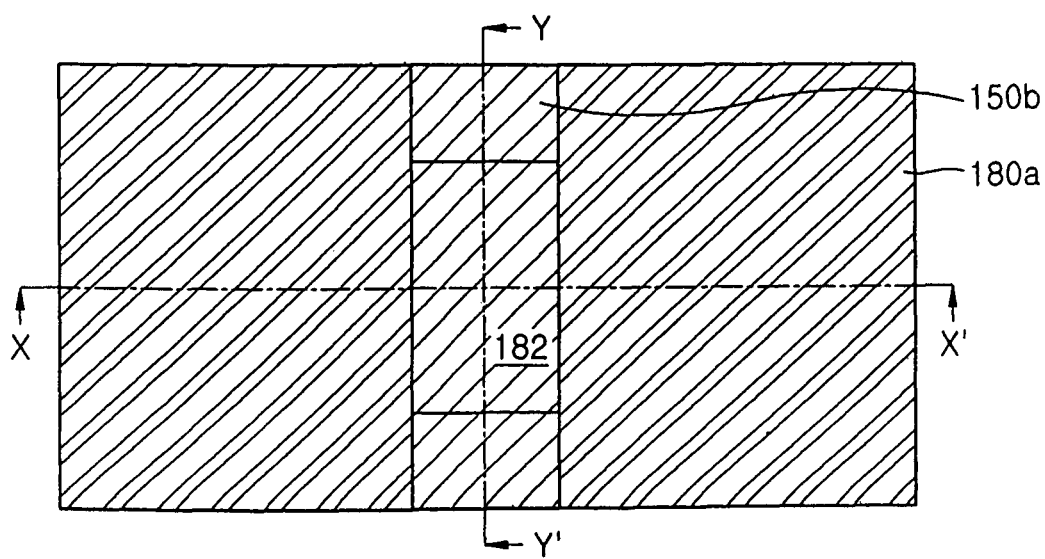
Figure 13B:
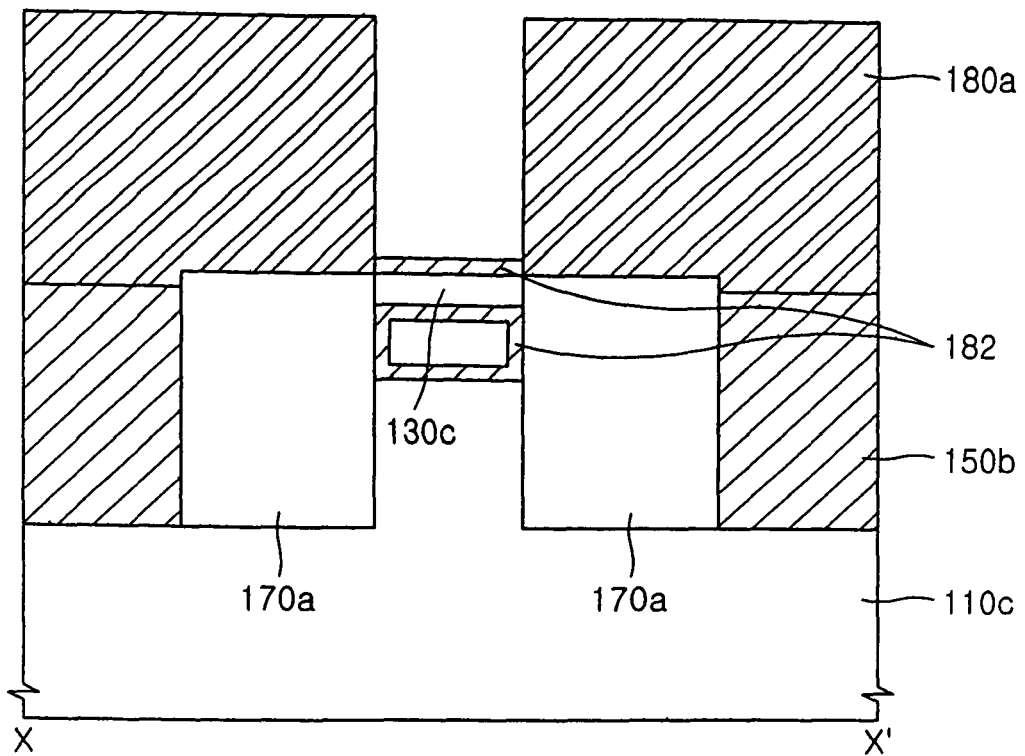
Figure 13C:
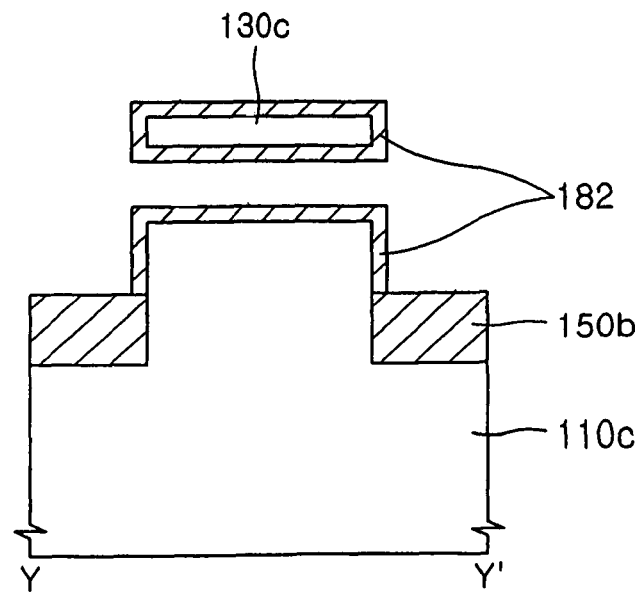

FIG. 13A is a plan view for formation of a tunneling insulating film in the field effect transistor after FIG. 12A, and FIGS. 13B and 13C are cross-sectional views respectively taken along lines X-X' and Y-Y' of FIG. 13A. Referring to FIGS. 13A through 13C, a tunneling oxide film 182 is formed on exposed silicon surfaces after FIG. 12A, including exposed surfaces of a semiconductor substrate 110c, a first single crystal semiconductor layer 130c, and a second single crystal semiconductor layer 170a in the tunnel TN.

The tunneling oxide film 182 is formed by a thermal anneal process in one embodiment of the present invention. In that case, the tunneling oxide film 182 may also be formed on the upper surface of the first single crystal semiconductor layer 130c exposed by the second trench T2, the first single crystal semiconductor layer 130c exposed by the third trench T3, and the side surfaces in the Y-Y' direction of the semiconductor substrate 110c.

Figure 14A:
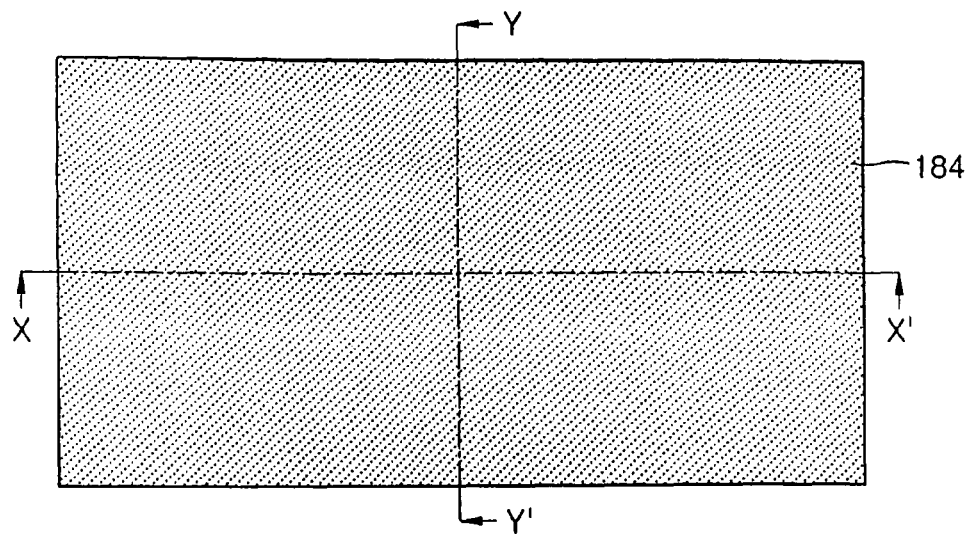
Figure 14B:
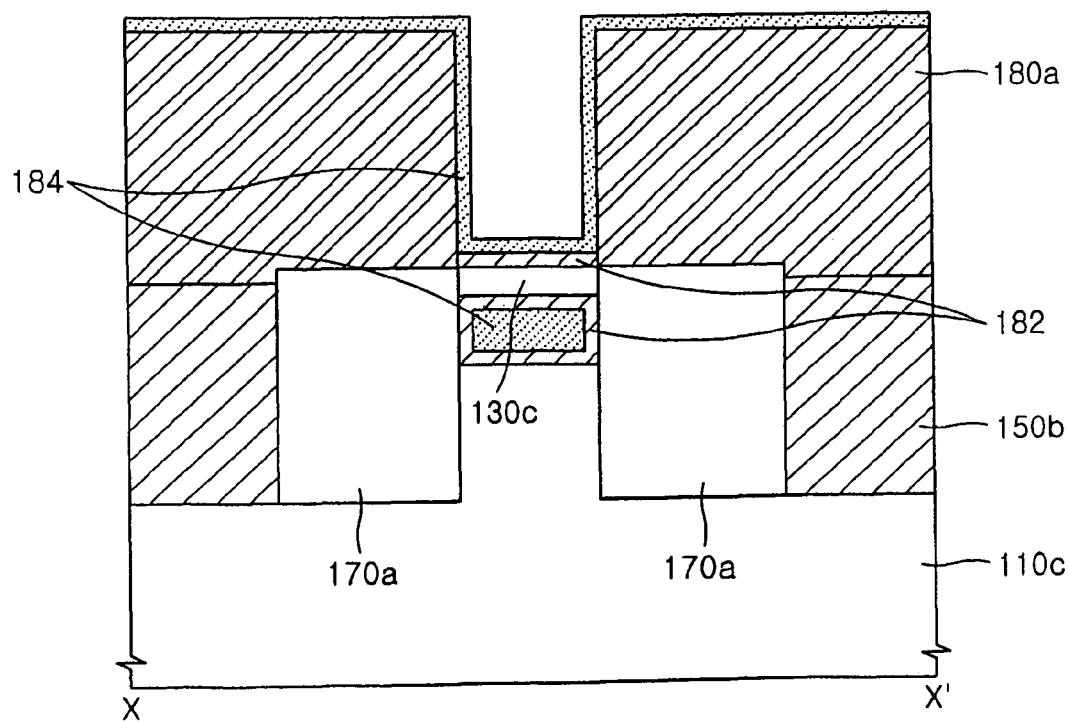
Figure 14C:
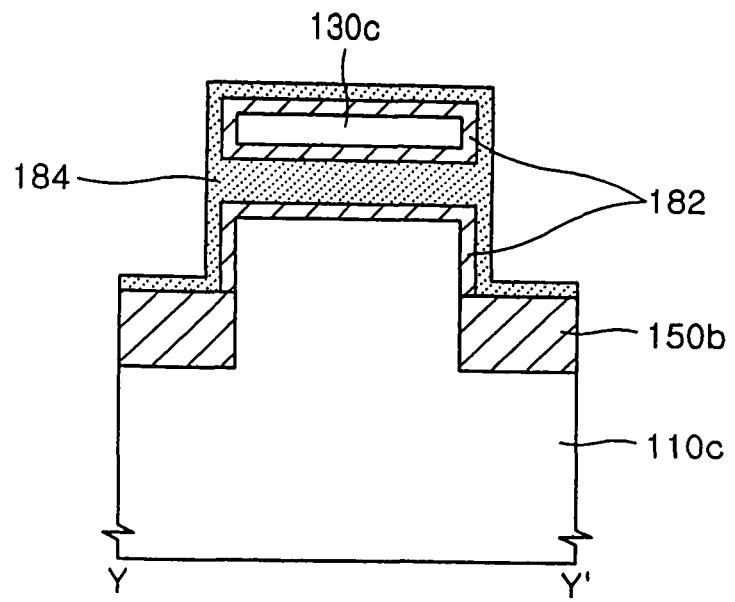

FIG. 14A is a plan view for deposition of a polysilicon film in the field effect transistor after FIG. 13A, and FIGS. 14B and 14C are cross-sectional views respectively taken along lines X-X' and Y-Y' of FIG. 14A. Referring to FIGS. 14A through 14C, a buried gate forming material film 184 is formed to fill the tunnel TN using low pressure chemical vapor deposition. The buried gate forming material film 184 is comprised of a conductive material, such as polysilicon having high step coverage for filling the tunnel TN having a narrow inlet. As a result, the polysilicon film 184 fills the tunnel TN, and covers other structures with a predetermined thickness, including the tunneling insulating film and the silicon oxide film 182.

Figure 15A:
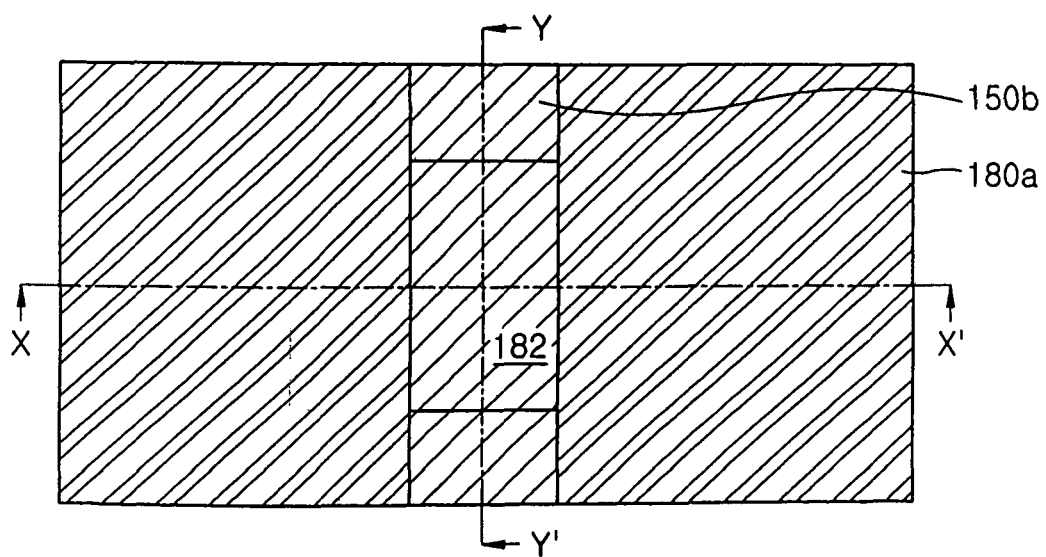
Figure 15B:
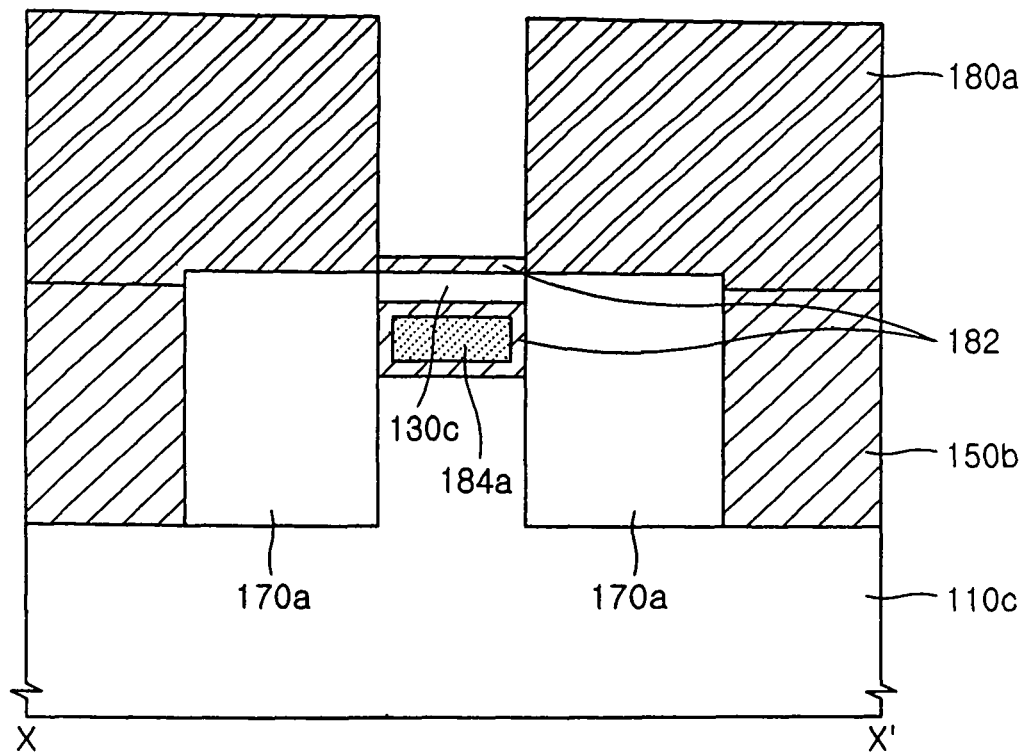
Figure 15C:
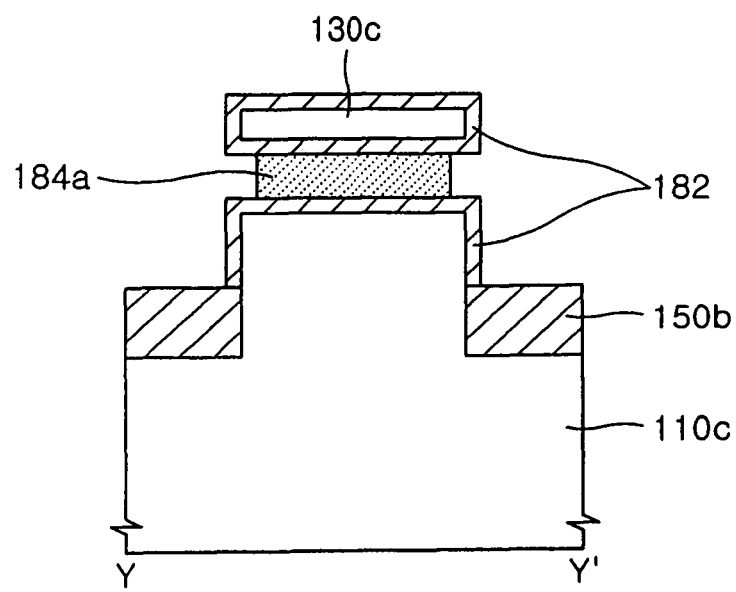

FIG. 15A is a plan view for formation of a buried gate pattern in the field effect transistor after FIG. 14A, and FIGS. 15B and 15C are cross-sectional views respectively taken along lines X-X' and Y-Y' of FIG. 15A. Referring to FIGS. 15A through 15C, portions of the polysilicon film 184 are removed except a buried gate pattern 184a filling the tunnel TN. The polysilicon film 184 is removed using an isotropic etch process such as a wet etch or a chemical dry etch, in one embodiment of the present invention. As the result, as depicted in FIG. 15C, the buried gate pattern 184a is recessed inward relative to the tunneling insulating film 182.

Figure 16A:
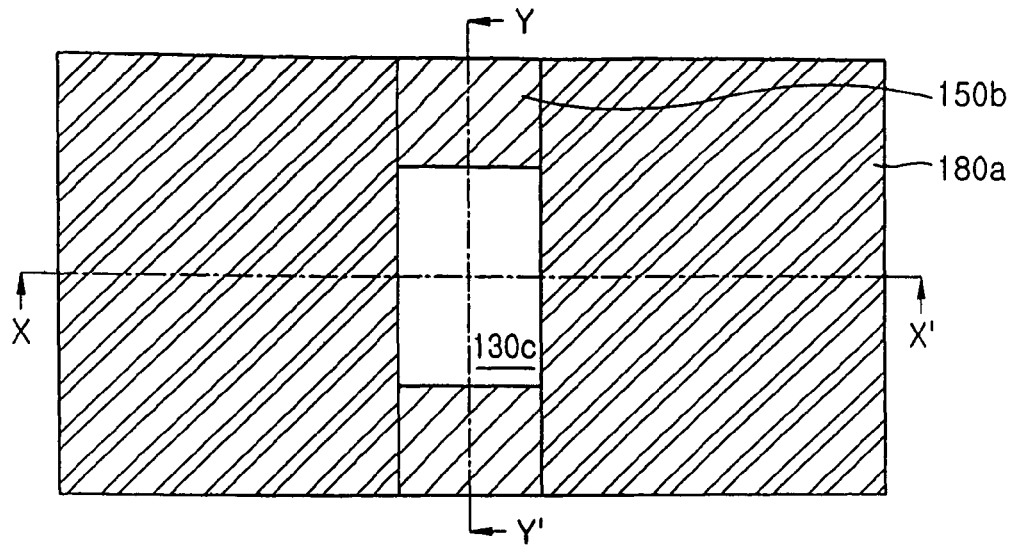
Figure 16B:
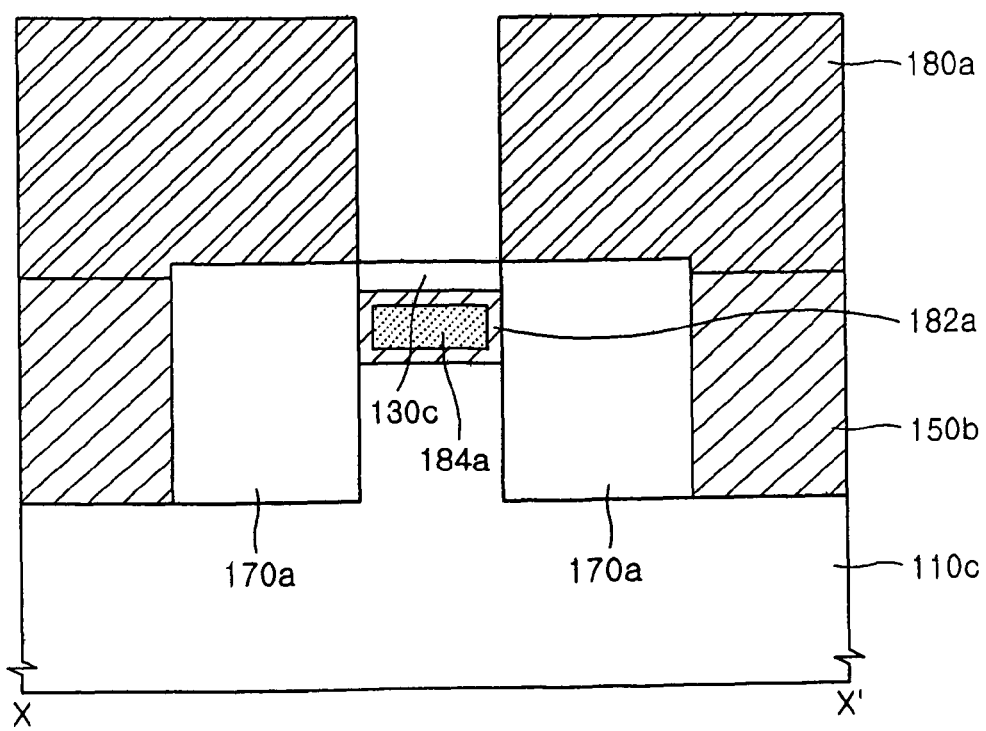
Figure 16C:
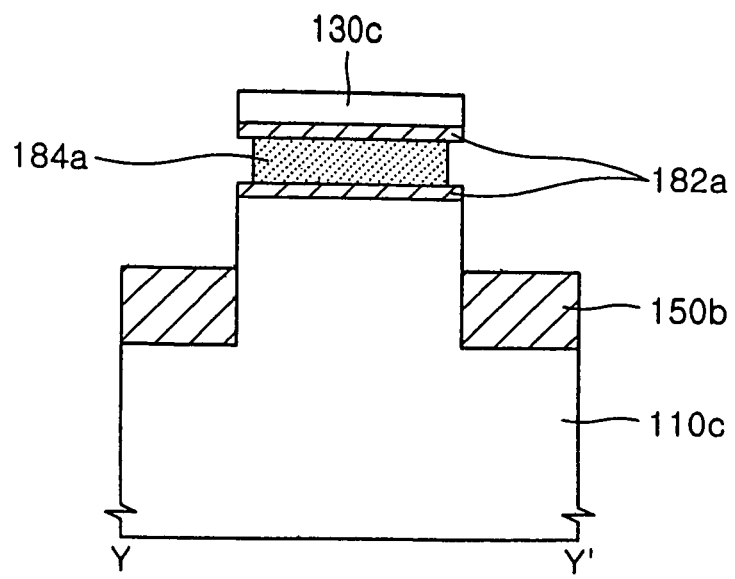

FIG. 16A is a plan view for removal of the silicon oxide film and the remaining tunneling oxide film in the field effect transistor after FIG. 15A, and FIGS. 16B and 16C are cross-sectional views respectively taken along lines X-X' and Y-Y' of FIG. 16A. Referring to FIGS. 16A through 16C, portions of the silicon oxide film 182 formed on the upper surface of the first single crystal semiconductor layer 130c exposed by the second trench T2 and formed on side surfaces across the Y-Y" direction of the first single crystal semiconductor layer 130c and the semiconductor substrate 110c are removed, using a conventional semiconductor etch process. As a result, the tunneling oxide film 182a remains substantially only in the tunnel TN.

Figure 17A:
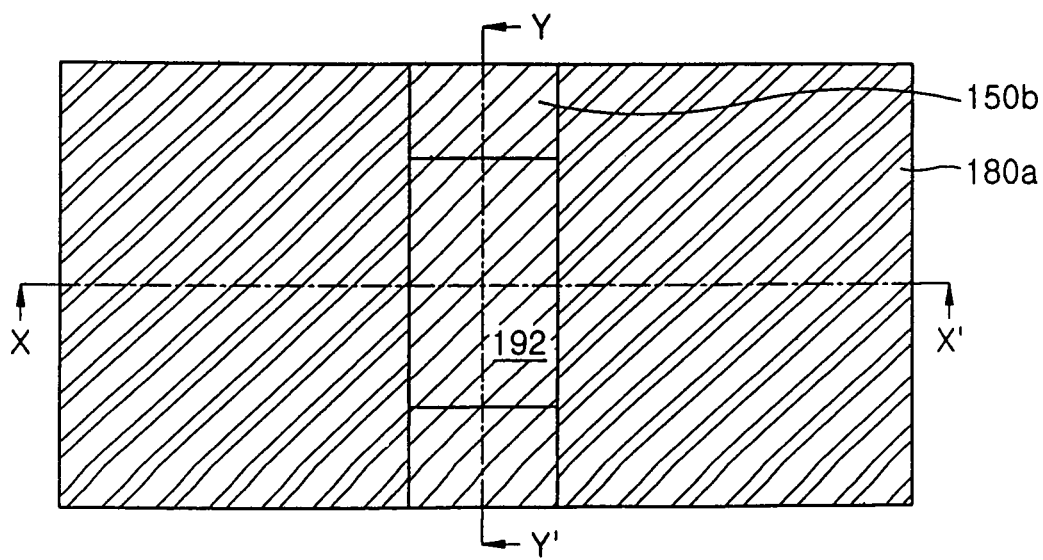
Figure 17B:
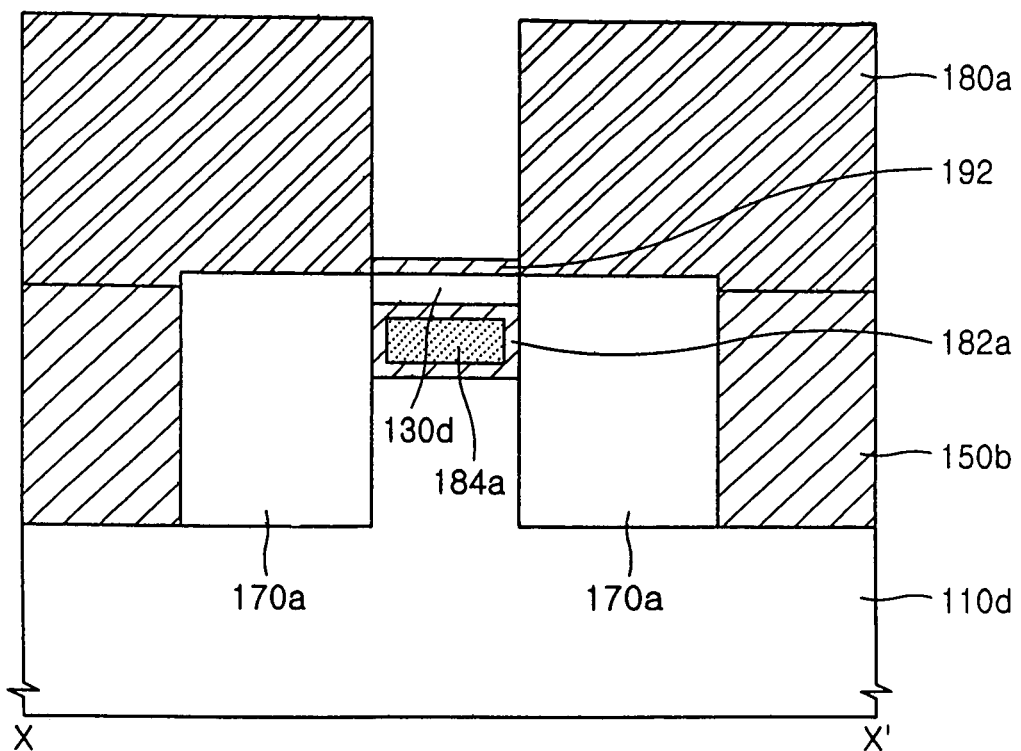
Figure 17C:
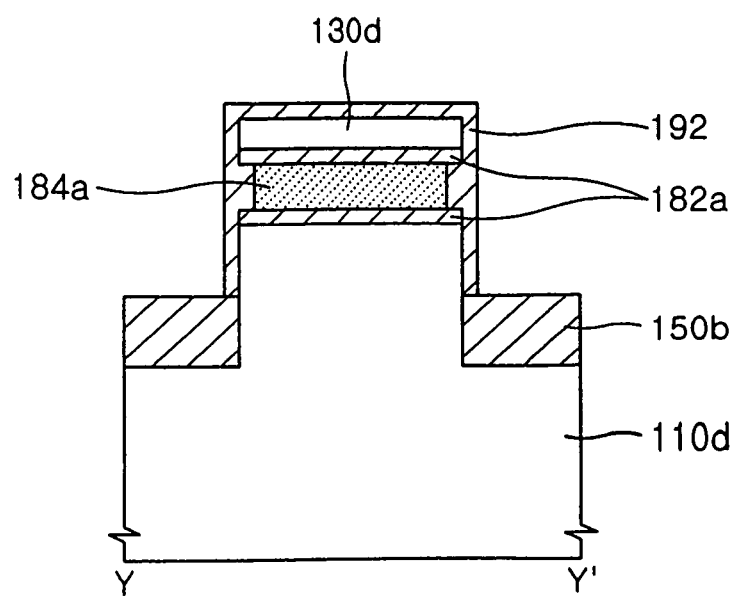

FIG. 17A is a plan view for formation of a gate insulating film in the field effect transistor after FIG. 16A, and FIGS. 17B and 17C are cross-sectional views respectively taken along lines X-X' and Y-Y' of FIG. 17A. Referring to FIGS. 17A through 17C, a thermal anneal is performed to form a gate insulating film 192 of the field effect transistor. The gate insulating film 192 is formed on the upper surface of the first single crystal semiconductor layer 130d. In addition, the gate insulating film 192 is formed with a predetermined thickness on exposed surfaces (as shown across the Y-Y' direction) of the first single crystal semiconductor layer 130c, the buried gate pattern 184a, and the semiconductor substrate 110d.

Figure 18A:
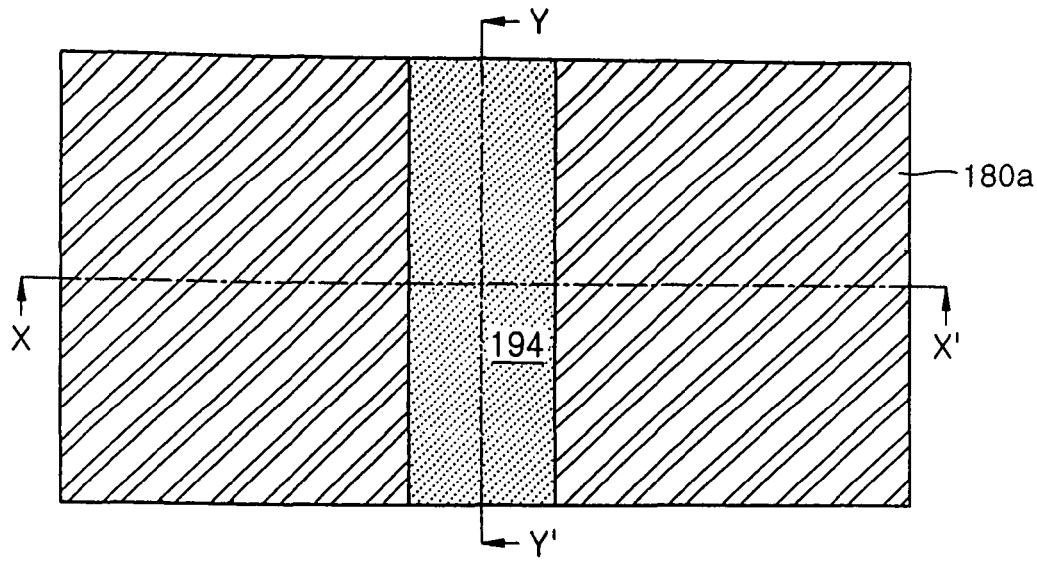
Figure 18B:
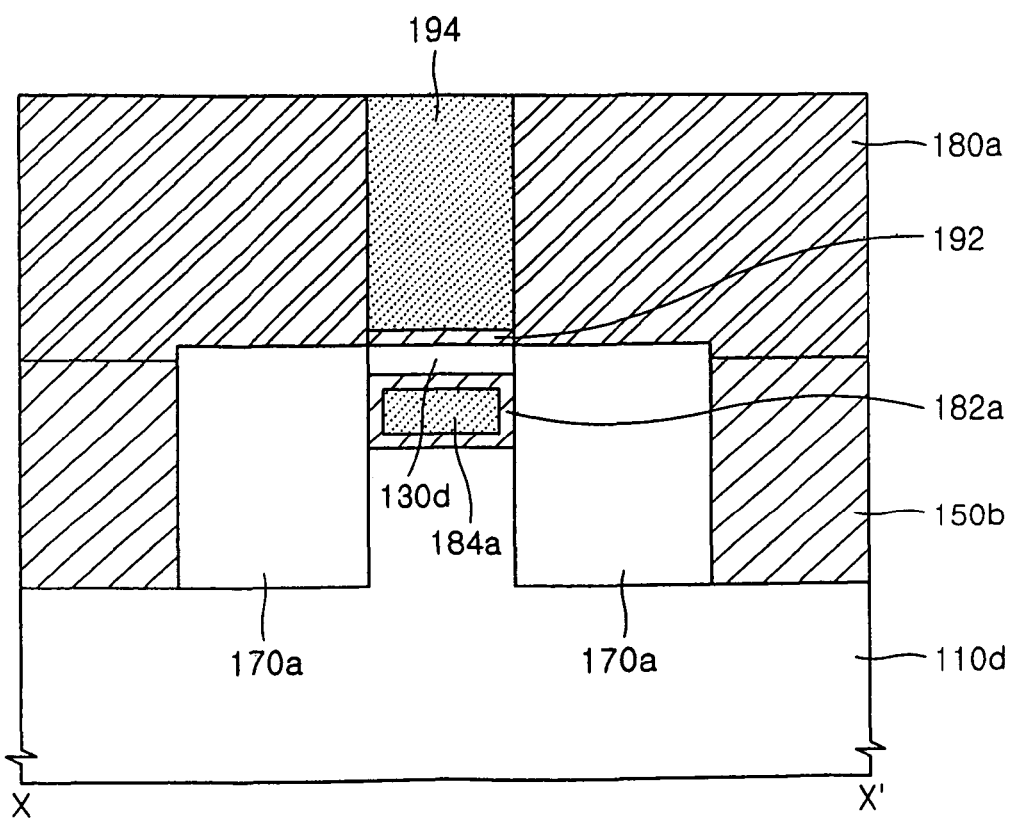
Figure 18C:
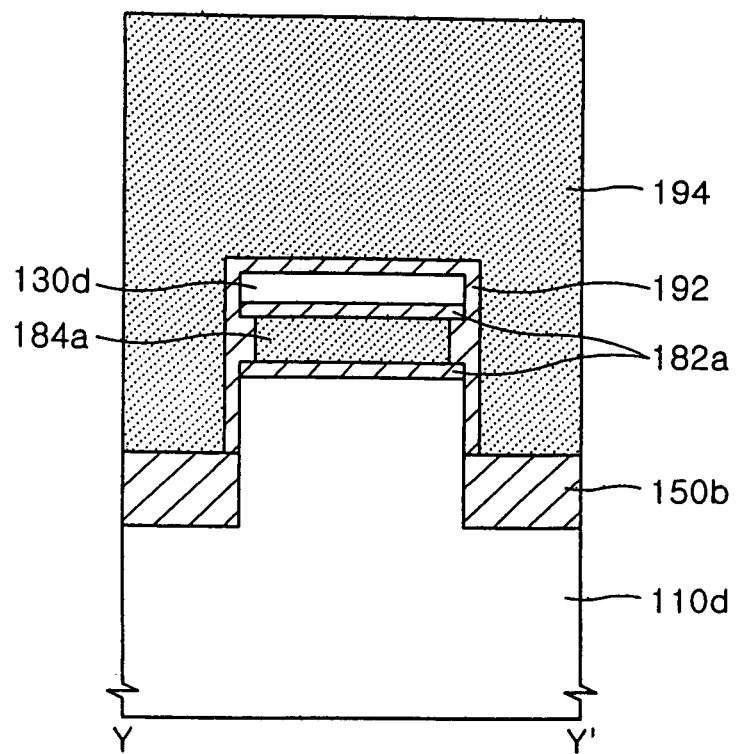

FIG. 18A is a plan view for formation of a select gate pattern 194 of the field effect transistor after FIG. 17A, and FIGS. 18B and 18C are cross-sectional views respectively taken along lines X-X' and Y-Y' of FIG. 18A. Referring to FIGS. 18A through 18C, after depositing a conductive material in the second trench T2 defined by the mold pattern 180a, the select gate pattern 194 is formed by planarizing the conductive material layer. The select gate pattern 194 forms a gate electrode of the field effect transistor. The select gate pattern 194 is comprised of a single film or a composite film of polysilicon, metal silicide, and/or a metal, in one embodiment of the present invention. A hard mask (not shown) may further be formed on an upper part of the select gate pattern 194.

Figure 19A:
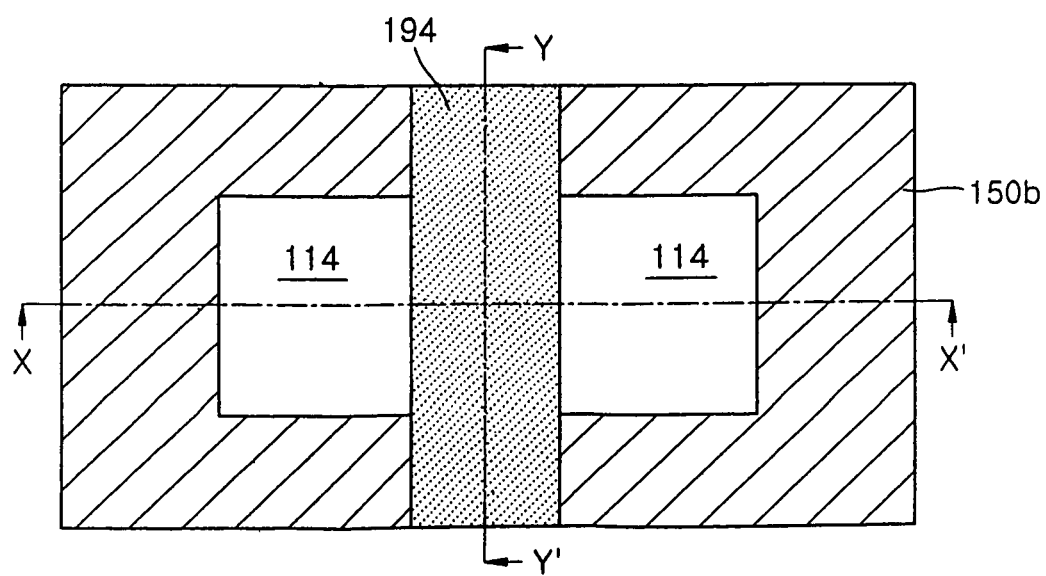
Figure 19B:
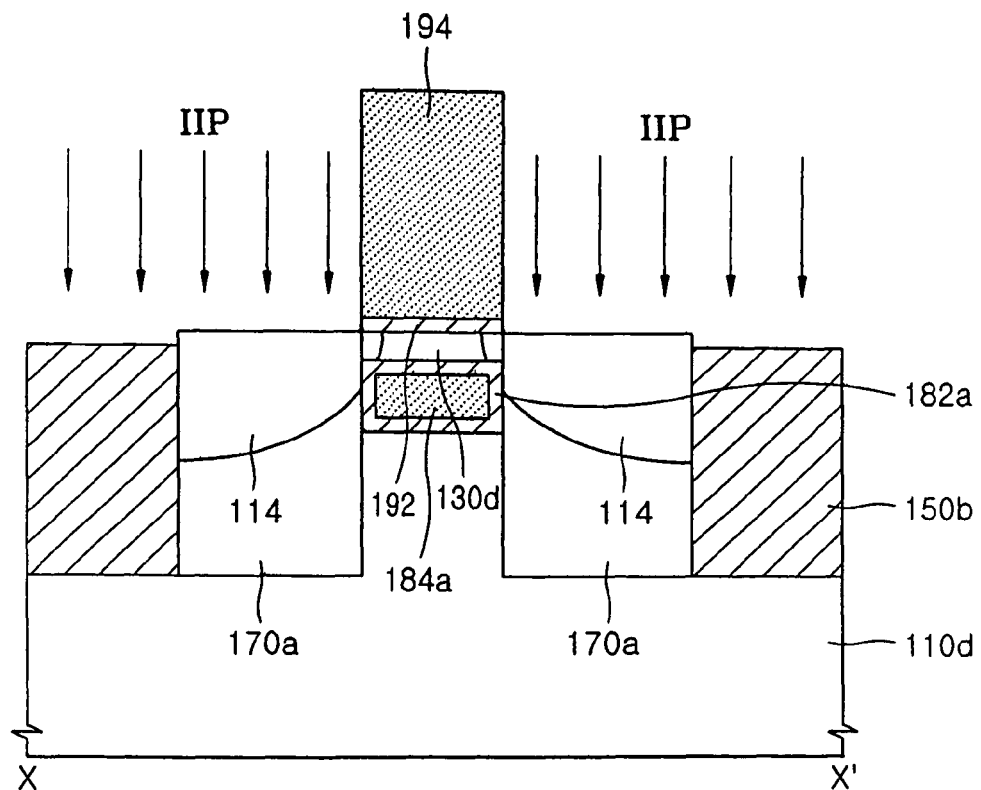
Figure 19C:
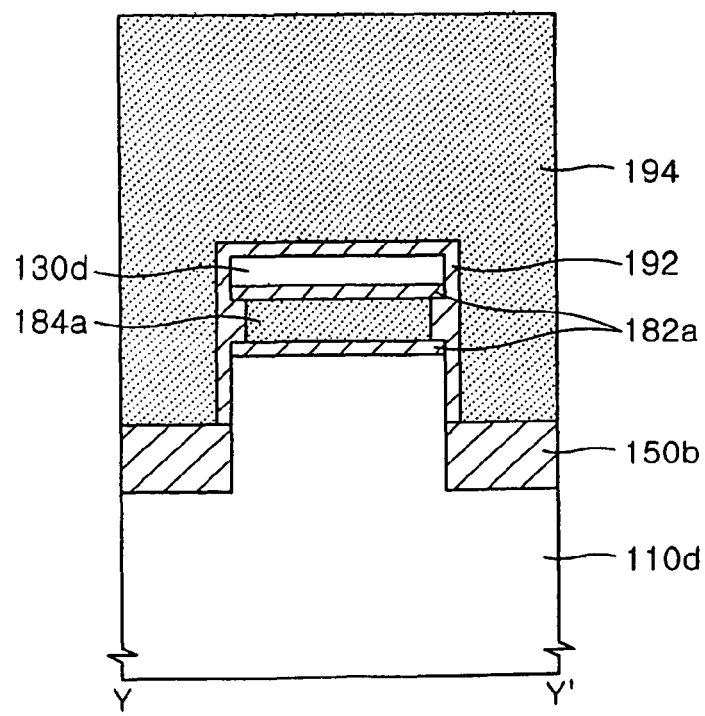

FIG. 19A is a plan view illustrating removal of the mold pattern for forming first source/drain regions of the field effect transistor structure after FIG. 18A, and FIGS. 19B and 19C are cross-sectional views respectively taken along lines X-X' and Y-Y' of FIG. 19A. Referring to FIGS. 19A through 19C, the mold pattern 180a is removed using a conventional semiconductor etch process. If the mold pattern 180a is comprised of silicon nitride, the mold pattern 180a is removed using a phosphoric acid strip process in one embodiment of the present invention.

Thereafter, first source/drain regions 114 are formed with the second single crystal semiconductor layer 170a by performing a second dopant injection process for injecting a dopant such as an N-type dopant. The select gate pattern 194 is used as a dopant injection mask in the second dopant injection process, in one embodiment of the present invention.

Figure 20A:
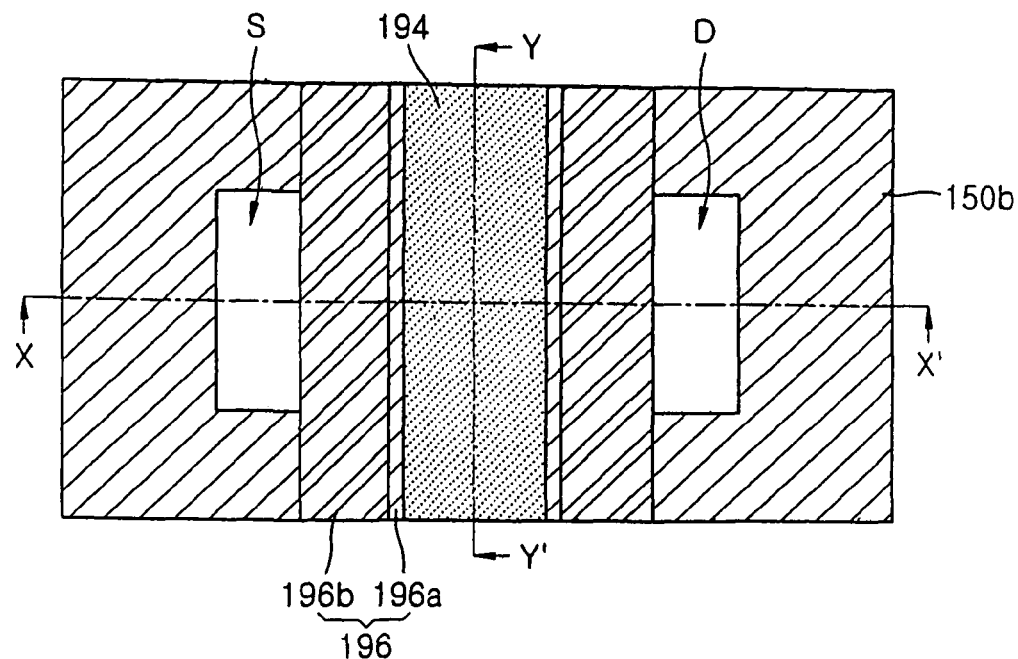
Figure 20B:
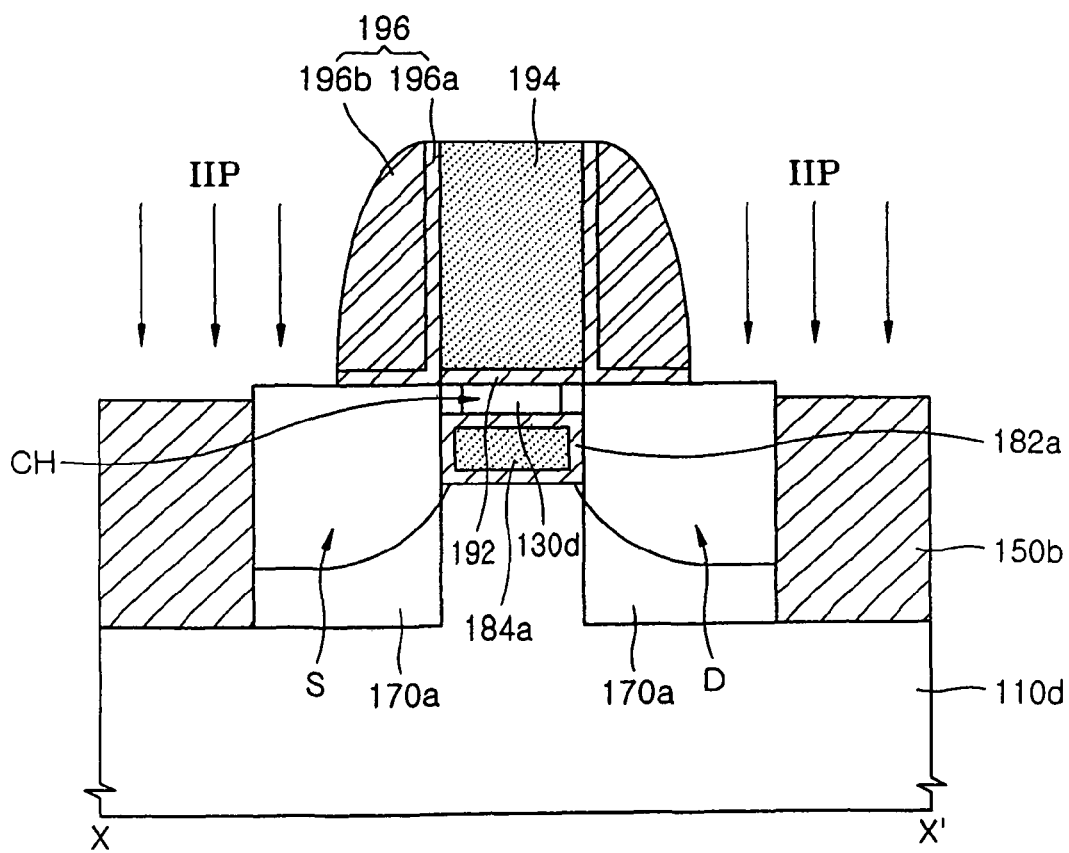
Figure 20C:
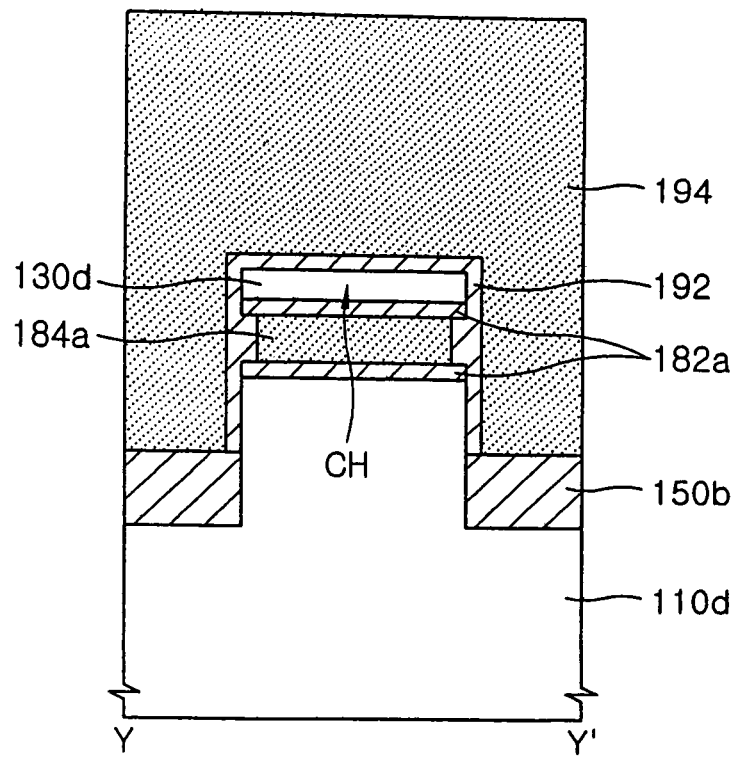

FIG. 20A is a plan view for formation of side wall spacers and source/drain regions in the field effect transistor structure after FIG. 19A, and FIGS. 20B and 20C are cross-sectional views respectively taken along lines X-X' and Y-Y' of FIG. 20A. Referring to FIGS. 20A through 20C, side wall spacers 196 are formed on both side walls of the select gate pattern 194 using a conventional semiconductor manufacturing process. The side wall spacers 196 include a single silicon nitride film 196b or a composite of a silicon oxide film 196a and the silicon nitride film 196b. That is, there are no specific limitations on the material and configuration for forming the side wall spacers 196.

Second source/drain regions S and D are formed by injecting a dopant, such as an N-type dopant, into the second single crystal semiconductor layer 170a using the select gate pattern 194 and the side wall spacers 196 as dopant injection masks. The second source/drain regions S and D overlap with the first source/drain regions 114 for forming an appropriate dopant profile of the source/drain regions S and D in the field effect transistor.

Afterward, the manufacture of the field effect transistor may be further completed with other conventional CMOS fabrication steps.

Figure 21A:
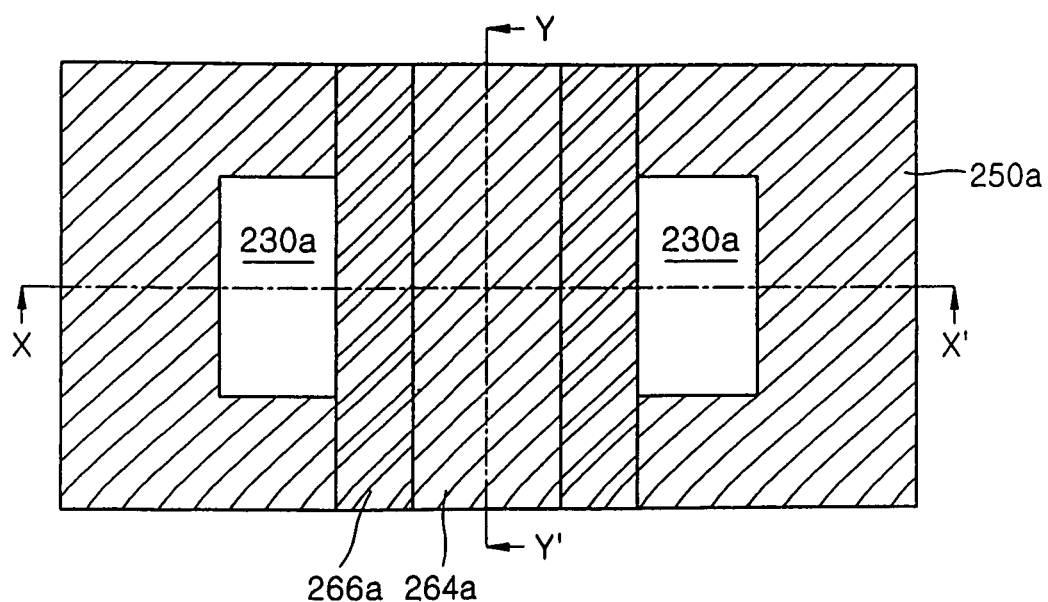
Figure 21B:
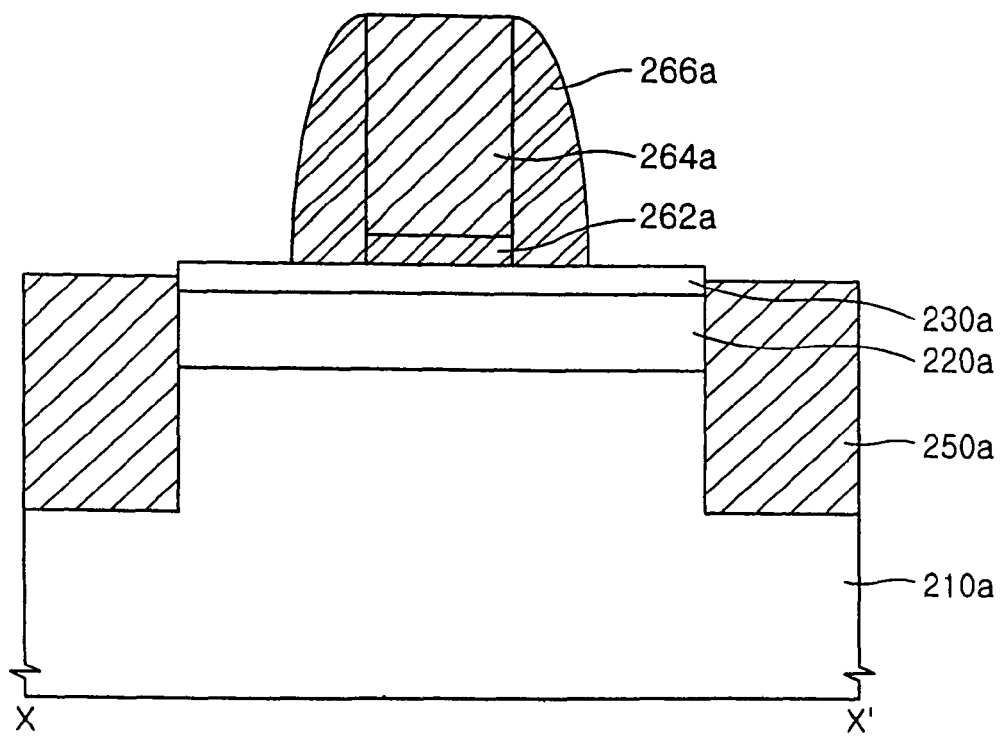
Figure 21C:
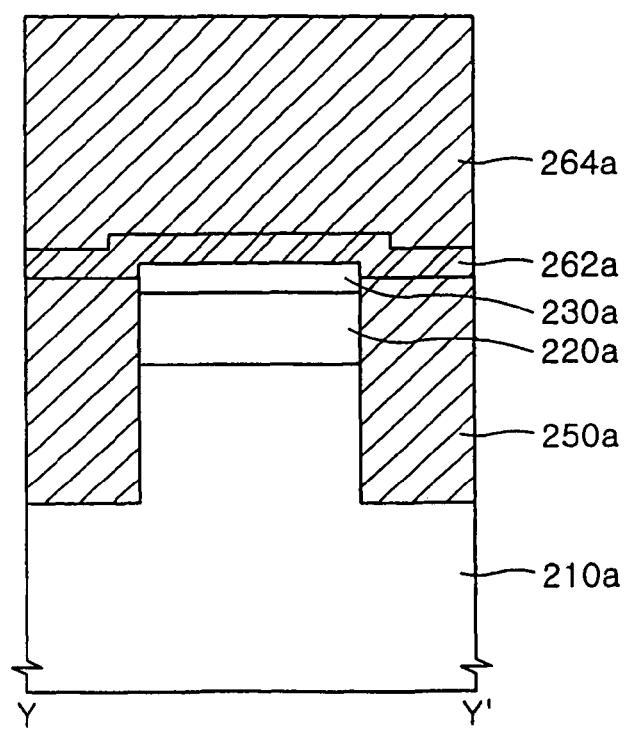
Figure 22A:
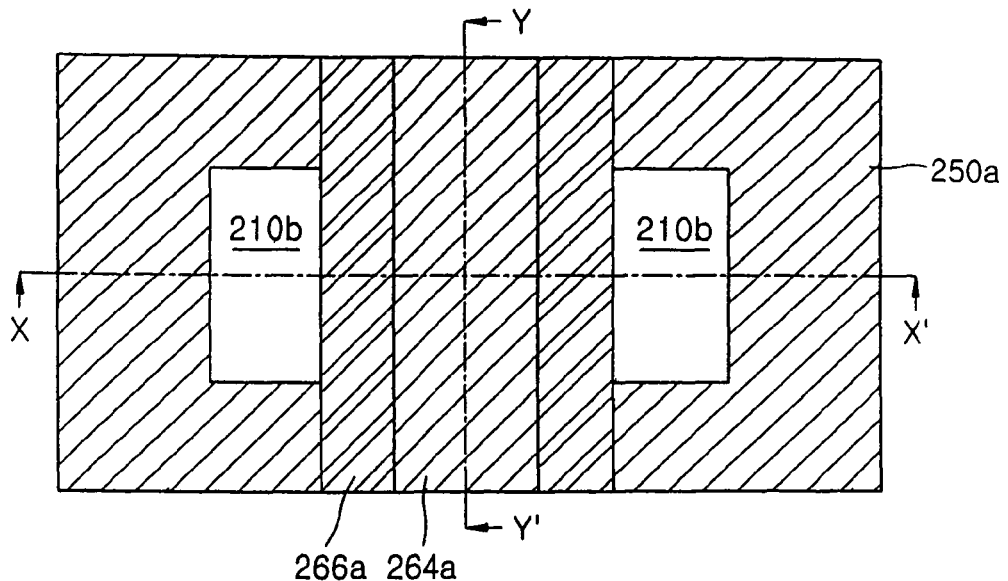
Figure 22B:
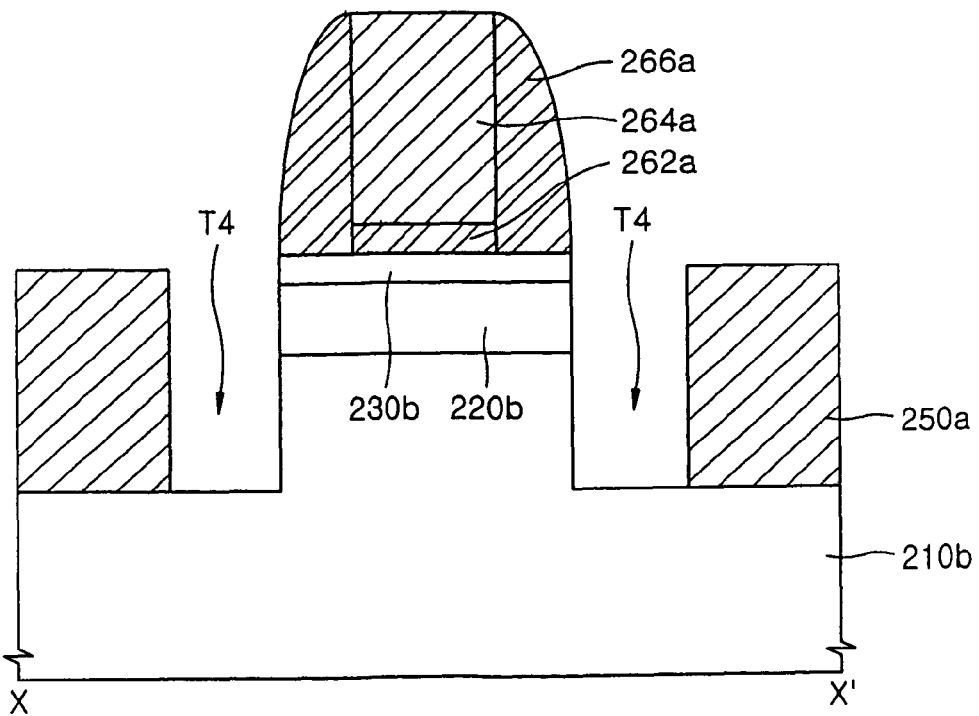
Figure 22C:
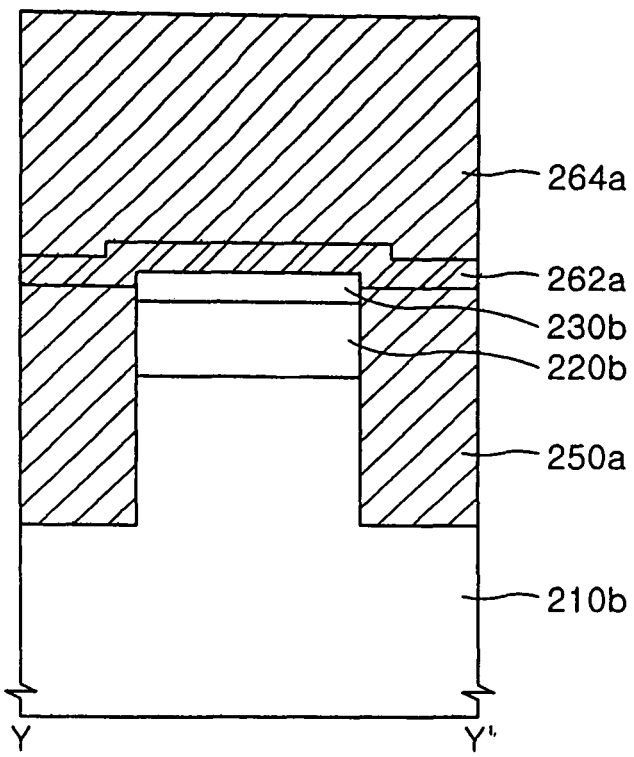
Figure 23A:
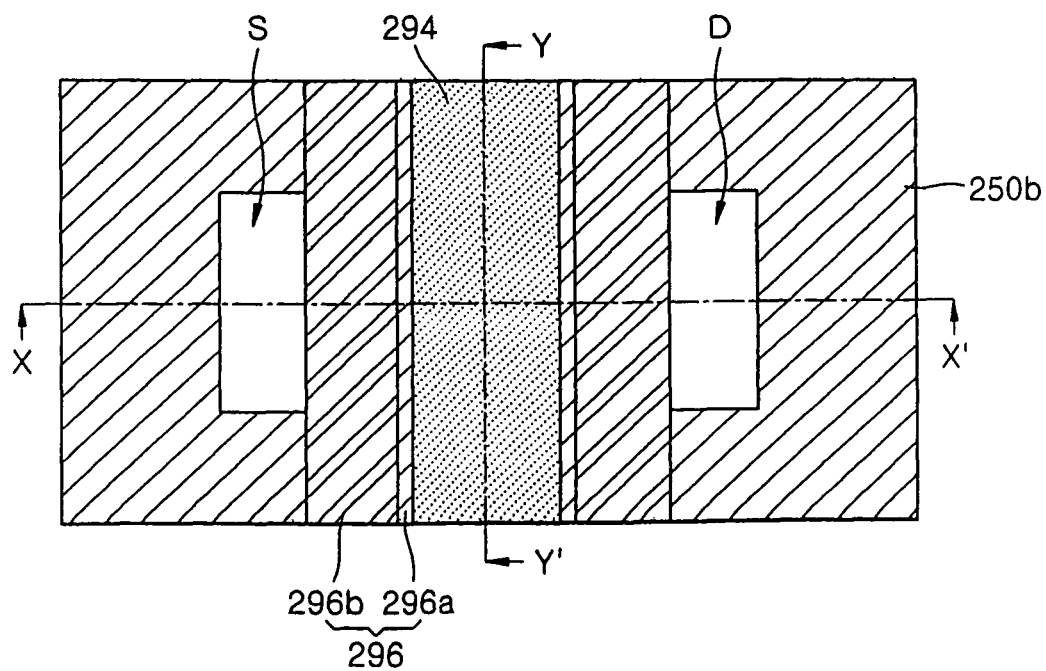
Figure 23B:
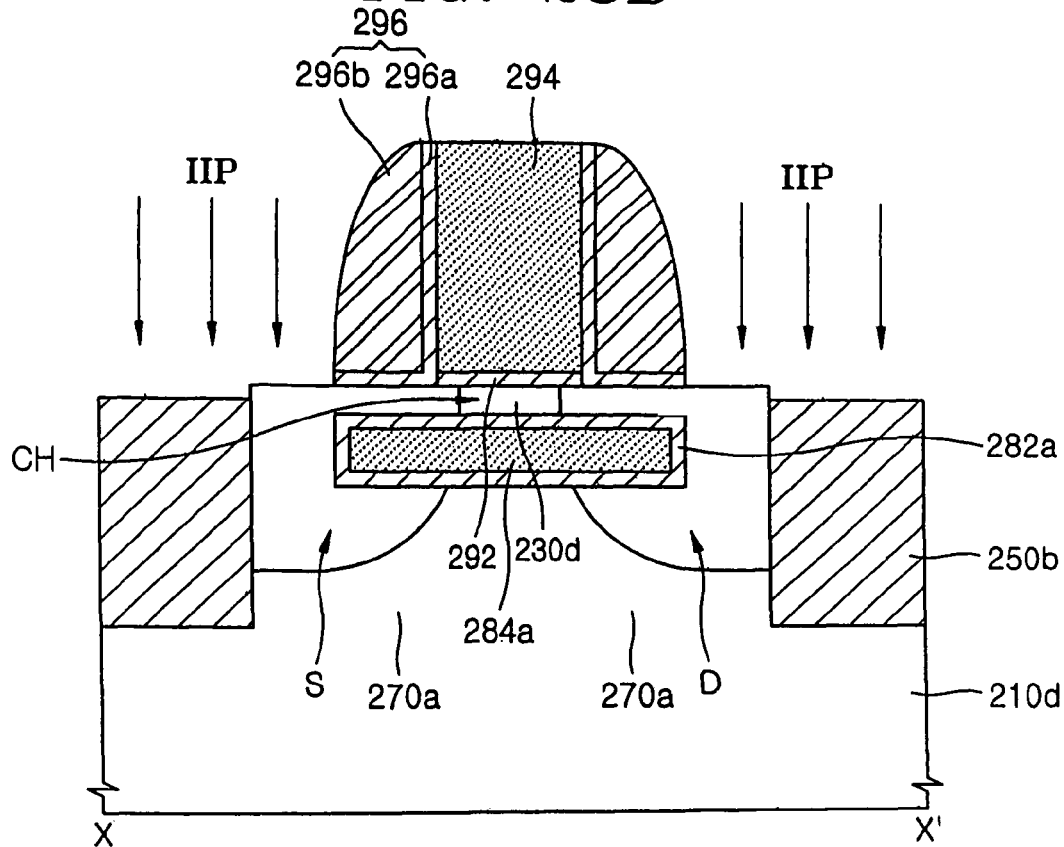
Figure 23C:
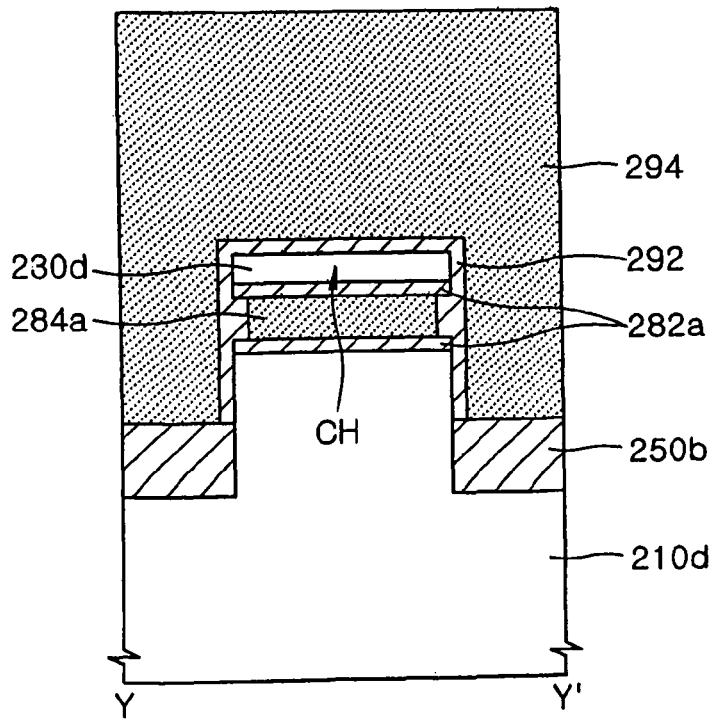

FIGS. 21A, 22A, and 23A are plan views for forming a field effect transistor structure according to a second embodiment of the present invention. FIGS. 21B, 22B, and 23B are cross-sectional views taken along lines XX' of FIGS. 21A, 22A, and 23A, respectively, and FIGS. 21C, 22C, and 23C are cross-sectional view taken along lines YY' of FIGS. 21A, 22A, and 23A, respectively.

FIG. 21A is a plan view for formation of a dummy gate pattern having spacers in the field effect transistor structure, and FIGS. 21B and 21C are cross-sectional views respectively taken along lines X-X' and Y-Y' of FIG. 21A. FIGS. 21A through 21C correspond to FIGS. 6A through 6C in the first embodiment. Therefore, the first embodiment described with reference to FIGS. 2A through 5C may also be applied to the present second embodiment.

Referring to FIGS. 21A through 21C, the present second embodiment differs from the first embodiment in that after forming an etch stopper pattern 262a and a dummy gate pattern 264a, dummy side wall spacers 266a are further formed on both side walls of the etch stopper pattern 262a and the dummy gate pattern 264a. As a result, a buried gate pattern 284a (refer to FIG. 23b) will eventually be wider than a select gate pattern 294a (refer to FIG. 23b).

FIG. 22A is a plan view for formation of a fourth trench T4 for manufacturing the field effect transistor structure after FIG. 21A, and FIGS. 22B and 22C are cross-sectional views respectively taken along lines X-X' and Y-Y' of FIG. 22A. The fourth trench T4 is formed similarly to the first trench T1 in the first embodiment.

Referring to FIGS. 22A through 22C, the fourth trench T4 is formed by sequentially etching the first single crystal semiconductor layer 230a, the sacrificial layer 220a, and the semiconductor substrate 210a, using the dummy gate pattern 264a and the dummy side wall spacers 266a as etch masks. As the result, the remaining first single crystal semiconductor layer 230b and the remaining sacrificial layer 220b have a width greater than the width of a select gate pattern 294 (refer to FIG. 23B).

Subsequently, similar fabrication steps as described with reference to FIGS. 8A through 19C are similarly performed.

Thereafter, FIG. 23A is a plan view of the resultant field effect transistor, and FIGS. 23B and 23C are cross-sectional views respectively taken along lines X-X' and Y-Y' of FIG. 23A. Referring to FIGS. 23A through 23C, the width of the buried gate pattern 284a is greater than the width of the buried gate pattern 184a in FIG. 20B. In addition, the width of the buried gate pattern 284a is greater than the length of the channel CH, that is, the distance between the source/drain regions S and D. Furthermore, the width of the buried gate pattern 284a is greater than the width of the select gate pattern 294.

Afterward, the manufacture of the field effect transistor may be further completed with other conventional CMOS fabrication steps.

FIGS. 20A through 20C and FIGS. 23A through 23C are plan views and cross-sectional views of the resulting field effect transistors fabricated according to the first and second embodiments of the present invention. The operation of such field effect transistors according to an embodiment of the present invention is now described with reference to FIGS. 20A through 20C and FIGS. 23A through 23C.

The buried gate pattern 184a or 284a is formed between the source/drain regions S and D. In addition, ends of the buried gate pattern 184a or 284a extend into the source/drain regions S and D. Furthermore, the tunneling insulating film 182a or 282a surrounds the buried gate pattern 184a or 284a to electrically isolate the buried gate pattern 184a or 284a from the source/drain regions S and D. Thus, the channel region CH is electrically floated by being completely surrounding by the source/drain regions S and D, the tunneling insulating film 182a or 282a, and the gate insulating film 192 or 292. Also, the channel CH is thin enough to be fully depleted when power is applied to the select gate pattern 194.

The field effect transistor of embodiments of the present invention utilizes a charge tunneling effect between the source region S (and/or the drain region D) and the buried gate pattern 184a or 284a, for writing and erasing operations. By controlling the amount of charge stored in the buried gate pattern 184a or 284a, the threshold voltage for the channel region CH is varied.

For an example write operation, assume that the S/D regions and the buried gate pattern 184a or 284a are doped with an n-type dopant. In that case, a negative voltage of sufficient magnitude is applied on the source region S or the drain region D, and the select gate pattern 194 or 294 is grounded or floated. As a result, electron tunneling occurs at the boundary between the source region S (or the source/drain regions S and D) and the buried gate pattern 184a or 284a through the tunneling insulating film 182a or 282a to reduce the potential of the buried gate patterns 184a and 284a to in turn induce hole accumulation in the channel region CH. Accordingly, the threshold voltage of the field effect transistor increases, (refer to the article "A Capacitorless Double Gate DRAM Technology for Sub-100-nm Embedded and Stand-Alone Memory applications", by Charles Kuo, IEEE TRANSACTIONS ON ELECTRON DEVICES, Vol. 50, No, 12, December 2003). In this manner, digital data ("0" or "1") may be written to the field effect transistor of embodiments of the present invention.

Also, an erase operation for the field effect transistor uses the F-N (Fowler-Nordheim) tunneling through the tunneling insulating film 182a or 282a to remove charge carriers stored in the buried gate pattern 184a or 284a to the source/drain regions S and D. For such an erase operation, a sufficient positive voltage is applied to the source/drain regions S and D.

For a read operation for the field effect transistor, a voltage that does not generate tunneling of charge carriers through the tunneling insulating film 182a or 282a is applied to the source region S and/or the drain region D. Thus, the tunneling insulating film 182a or 282a is desired to have a thickness that is appropriate for F-N tunneling during writing and erasing operations, but that does not generate F-N tunneling during a reading operation.

Therefore, according to embodiments of the present invention, a non-destructive read operation is possible, which is a feature of a non-volatile memory device. Thus, the field effect transistor of embodiments of the present invention may be advantageously formed as a cell of a non-volatile memory device.

Also, such a field effect transistor is advantageous for increased integration, since short channel effects are suppressed by having a thin body channel CH. Furthermore, as depicted in FIGS. 20B and 23C, such a field effect transistor has a floating channel region CH that is electrically isolated from the semiconductor substrates 110d, 170a, 210d, and 270a for reducing parasitic current.

Figure 24A:
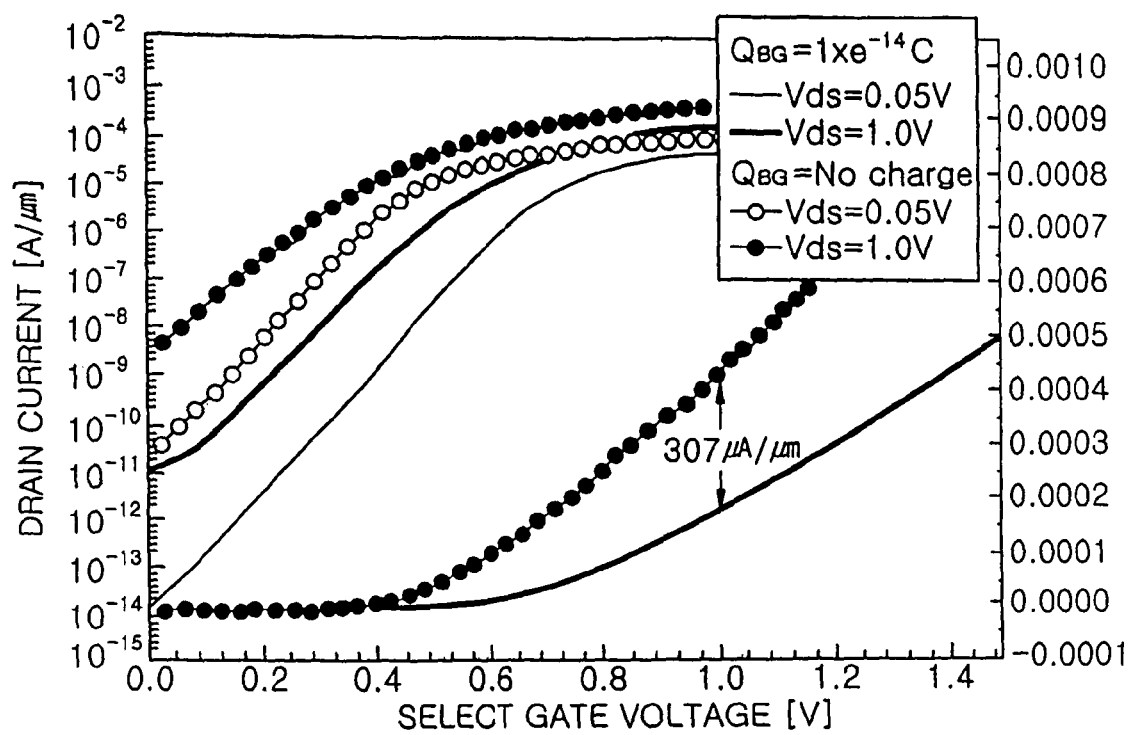
FIG. 24A shows current versus voltage plots for the field effect transistor of embodiments of the present invention when no charge is stored in the buried gate pattern and when $1 \times e^{-14}$ C of electrons is stored in the buried gate pattern.

FIG. 24A shows a current versus voltage plot for the field effect transistor of embodiments of the present invention when no charge is stored in the buried gate pattern 284a and when $1 \times e^{-14}$ C of electrons is stored in the buried gate pattern 284a. For the experiment, the select gate pattern 294 has a width of 0.1 μm, the gate oxide film 292 has a width of 2 nm, the tunneling oxide film 282a has a thickness of 5 nm, the buried gate pattern 284a has a width of 0.2 μm, the channel region CH has a width of 1 μm, and the channel region CH is doped with the dose of $1 \times e^{-17}$ cm$^{-2}$. The select gate pattern 294 is comprised of a metal having a work function of 4.46 eV, which is 0.15 eV higher than a middle band-gap level.

Referring to FIG. 24A, when a predetermined voltage is applied to the select gate pattern 294, the drain current decreases when $1 \times e^{-14}$ C of electrons is stored in the buried gate pattern 284a, compared to the case when no charge is stored in the buried gate pattern 284a. Especially, if 1.0 V is applied to the select gate pattern 294 and $V_{DS}$ is 1.0V, the drain current is decreased to approximately 307 μA/μm.

Figure 24B:
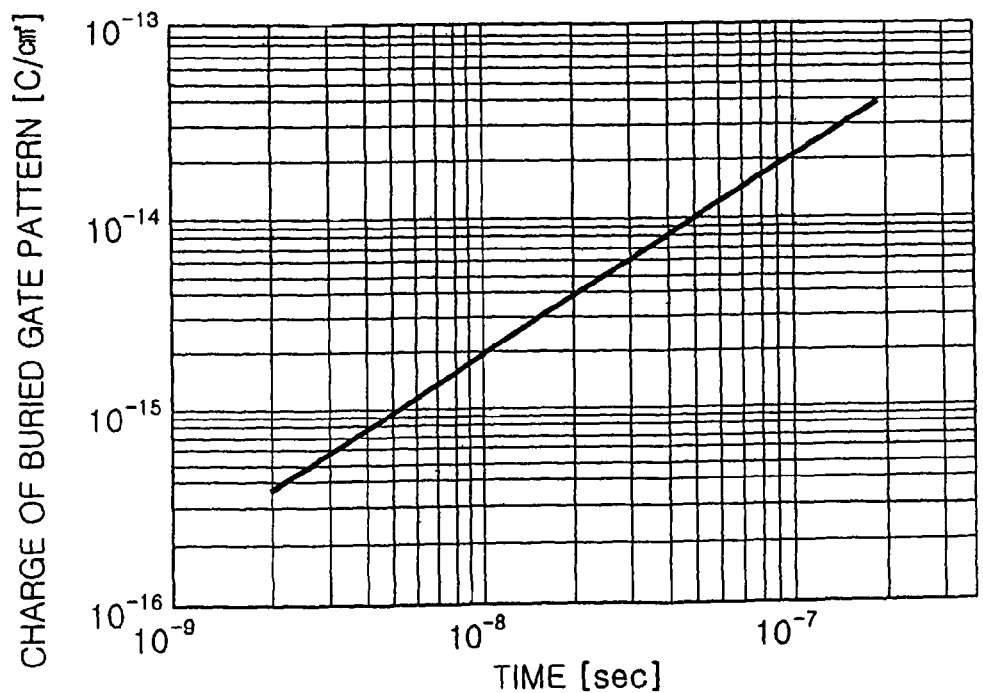
FIG. 24B shows a graph of charge injection time versus amount of charge stored in the buried gate pattern.

FIG. 24B shows a graph of charge injection time versus amount of charge stored in the buried gate pattern 284a. Referring to FIG. 24B, the time duration for injecting $1 \times e^{-14}$ C of electrons into the buried gate pattern 284a is approximately 50 ns, when −5 V is applied to the source/drain regions S and D and the select gate pattern 294 and the semiconductor substrate 110d are grounded. That is, the amount of charge injected into the buried gate pattern 284a is relatively small compared to a conventional DRAM cell, but the time required for the write operation is equivalent to that of a conventional DRAM cell. Therefore, the field effect transistor of embodiments of the present invention may advantageously form a memory cell in a capacitor-less 1T-DRAM device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A field effect transistor comprising:
   a buried gate pattern comprised of a semiconductor material formed in a substrate;
   a tunneling insulating film that surrounds the buried gate pattern;
   a channel region comprised of a semiconductor material bounded by source and drain regions, a gate insulating film, and the tunneling insulating film; and
   a select gate pattern disposed on the gate insulating film;

wherein the buried gate pattern and the tunneling insulating film extend into the source and drain regions, and wherein a portion of the select gate pattern extends down toward the substrate to overlap with sidewalls of the channel region and with sidewalls of the buried gate pattern along a length of the channel region and the buried gate pattern.

2. The field effect transistor of claim 1, and wherein the gate insulating film is disposed between the select gate pattern and the channel region, and wherein the gate insulating film contacts the tunneling insulating film, and wherein the gate insulating film contacts the buried gate pattern.

3. The field effect transistor of claim 2, wherein a width of the buried gate pattern is less than a width of the select gate pattern.

4. The field effect transistor of claim 2, wherein a width of the buried gate pattern is greater than a width of the select gate pattern.

5. The field effect transistor of claim 1, wherein the channel region has P-type conductivity, and wherein the buried gate pattern has N-type conductivity.

6. The field effect transistor of claim 1, wherein the channel region is fully depleted during operation of the field effect transistor.

7. The field effect transistor of claim 1, wherein an amount of charge stored in the buried gate pattern determines a threshold voltage of the field effect transistor.

8. The field effect transistor of claim 1, wherein the field effect transistor forms a memory cell of a capacitor-less one transistor-DRAM device.

9. The field effect transistor of claim 1, wherein the field effect transistor forms a memory cell of a non-volatile memory device.

10. The field effect transistor of claim 1, wherein the source and drain regions are disposed in a semiconductor material filling trenches formed around the channel region and the buried gate pattern.

11. The field effect transistor of claim 1, wherein the gate insulating film extends below the buried gate pattern toward the substrate.

12. The field effect transistor of claim 1, wherein the source and drain regions are formed in a semiconductor material filling trenches around the channel region, and wherein a portion of the semiconductor material filling the trenches remains undoped between each of the source and drain regions and the substrate.

13. A field effect transistor comprising:

a gate electrode;

a floating gate buried under the gate electrode in a substrate;

an insulating film that surrounds the floating gate such that the floating gate is electrically isolated;

a channel region between the gate electrode and the floating gate; and source and drain regions formed at sides of the channel region;

wherein the floating gate and the insulating film extend to the source and drain regions, and wherein a portion of the gate electrode extends down toward the substrate to overlap with sidewalls of the channel region and with sidewalls of the floating gate along a length of the channel region and the floating gate.

14. The field effect transistor of claim 13, wherein the insulating film includes a tunnel insulating film that surrounds the floating gate in a channel length cross-section and a gate insulating film that covers sidewalls of the floating gate in a channel width cross-section.

15. The field effect transistor of claim 13, wherein the channel region is fully depleted during operation of the field effect transistor.

16. The field effect transistor of claim 13, wherein the source and drain regions are formed in a semiconductor material filling trenches around the channel region, and wherein a portion of the semiconductor material filling the trenches remains undoped between each of the source and drain regions and the substrate.

* * * * *